(12) United States Patent
Masuda

(10) Patent No.: US 8,022,463 B2
(45) Date of Patent: Sep. 20, 2011

(54) SEMICONDUCTOR DEVICE AND METHOD OF MANUFACTURING THE SAME

(75) Inventor: Kazunori Masuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 12/499,352

(22) Filed: Jul. 8, 2009

(65) Prior Publication Data

US 2010/0006917 A1   Jan. 14, 2010

(30) Foreign Application Priority Data

Jul. 14, 2008   (JP) .................................. 2008-183210

(51) Int. Cl.
*H01L 29/788* (2006.01)

(52) U.S. Cl. ........ 257/316; 257/314; 257/315; 257/388; 257/264; 257/E29.003

(58) Field of Classification Search .......... 257/314–316, 257/388, 364, 288, 296, 384, E29.03
See application file for complete search history.

(56) References Cited

U.S. PATENT DOCUMENTS

| 6,573,132 B1 | 6/2003 | Uehara et al. |
| 6,713,826 B2 | 3/2004 | Uehara et al. |
| 6,927,132 B2 * | 8/2005 | Iguchi et al. ................ 438/261 |

FOREIGN PATENT DOCUMENTS

JP   2000-340792   12/2000

* cited by examiner

*Primary Examiner* — Cuong Q Nguyen
*Assistant Examiner* — Tran Tran
(74) *Attorney, Agent, or Firm* — Oblon, Spivak, McClelland, Maier & Neustadt, L.L.P.

(57) ABSTRACT

This semiconductor device comprises a semiconductor substrate, a gate insulating film formed thereon, and a gate electrode formed through the gate insulating film on the semiconductor substrate. The first silicon nitride film is formed on the upper surface of the gate electrode, and a protection insulating film is formed on the side thereof. The second silicon nitride film is formed on the side of the protection insulating film. The third silicon nitride film is formed on the upper surface of the protection insulating film, and the bottom thereof is formed on a higher position than the bottom of the first silicon nitride film.

8 Claims, 21 Drawing Sheets

SEMICONDUCTOR DEVICE AND METHOD OF MANUFACTURING THE SAME

CROSS REFERENCE TO RELATED APPLICATIONS

This application is based on and claims the benefit of priority from prior Japanese Patent Application No. 2008-183210, filed on Jul. 14, 2008, the entire contents of which are incorporated herein by reference.

BACKGROUND OF THE INVENTION

1. Field of the Invention

The present invention relates to the semiconductor device, more particularly, to a semiconductor device with a self-aligned contact, and a method of manufacturing the same.

2. Description of the Related Art

In order for miniaturization and integration of semiconductor devices, it is important that a distance between a gate electrode and a diffusion layer contact of a transistor is shortened.

In the conventional art, a gate electrode and a diffusion layer contact are formed with a certain distance therebetween to prevent them from contacting to each other. This prevents miniaturization and integration of semiconductor devices.

As a method to shorten the distance between a gate electrode and a diffusion layer contact, a method is proposed in which the diffusion layer contact is formed in a self-alignment manner with respect to the gate electrode. However, this method has the following problem. That is, when a contact hole for a diffusion layer contact is formed to overlap with a gate electrode, a protection oxidation film formed on the side of the gate electrode is subject to etching. As a method for avoiding this, the following method is known. This method forms a protection oxidation film on the side of the gate electrode. Then, a nitride film (a stopper film) having a selection ratio with respect to the oxidation film is formed on the upper and side surface of the protection oxidation film (Japanese Patent Laid-Open No. 2000-340792).

This method uses the nitride film formed on the upper and side surface of the protection oxidation film as the stopper. Therefore, it can prevent the protection oxidation film from being etched. However, when a nitride film with a lot of electric-charge traps is formed close to a silicon substrate surface, transistor properties may fluctuate. This is regarded as a problem.

In addition, when a nitride film is formed on the side of the gate electrode in the nonvolatile semiconductor storage device, there arises a problem that the electric-charge retention property thereof deteriorates, and the parasitic capacitance thereof increases. This is also regarded as a problem.

Therefore, with the conventional art, it is difficult to provide a small semiconductor device that can be formed without deteriorating transistor properties.

SUMMARY OF THE INVENTION

A semiconductor device according to an aspect of the present invention comprises: a semiconductor substrate; a gate insulating film formed on the semiconductor substrate; a gate electrode formed on the semiconductor substrate through the gate insulating film; a first silicon nitride film formed on the upper surface of the gate electrode; a protection insulating film formed on the side of the gate electrode; a second silicon nitride film formed on the side of the protection insulating film; and a third silicon nitride film formed on the upper surface of the protection insulating film, and having a bottom surface formed on the upper area than the bottom of the first silicon nitride film.

A method of manufacturing a semiconductor device according to an aspect of the present invention comprises: sequentially laminating, on a semiconductor substrate, a gate oxide film, a first conductive layer as a gate electrode, and a first silicon nitride film, and thereafter etching them to form a pattern of the gate electrode; forming a protection insulating film on the semiconductor substrate; forming a second silicon nitride film on the protection insulating film;

depositing an interlayer insulating film on the semiconductor substrate; etching the interlayer insulating film to expose the second silicon nitride film; etching the surface portion of the second silicon nitride film to expose the protection insulating film; removing the protection insulating film formed on the upper surface of the first silicon nitride film by etching; etching the protection insulating film formed on the side of the first silicon nitride film to remove the protection insulating film until the upper surface of the protection insulating film formed on the side of the first silicon nitride film is positioned between the upper surface and the bottom surface of the first silicon nitride film; forming a third silicon nitride film on the side of the first silicon nitride film; forming a contact hole by etching the interlayer insulating film using the first to third silicon nitride films as a stopper; and forming a contact by laminating a conductive layer in the contact hole.

A method of manufacturing a semiconductor device according to another aspect of the present invention comprises: sequentially laminating on the semiconductor substrate, a gate oxide, a second conductive layer as a floating gate electrode, an inter-gate insulating film, a third conductive layer as a control gate electrode, and a first silicon nitride film, then performing an etching for forming a pattern of the floating gate electrode, the inter-gate insulating film and the control gate electrode;

forming a protection insulating film on the semiconductor substrate; forming a second silicon nitride film on the protection insulating film; laminating an interlayer insulating film on the semiconductor substrate, etching the interlayer insulating film to expose the second silicon nitride film; etching the surface portion of the second silicon nitride film to expose the protection insulating film;

removing the protection insulating film formed on the upper surface of the first silicon nitride film by etching; etching the protection insulating film formed on the side of the first silicon nitride film to remove the protection insulating film until the upper surface of the protection insulating film formed on the side of the first silicon nitride film is positioned between the upper surface and the bottom surface of the first silicon nitride film; forming a third silicon nitride film on the side of the first silicon nitride film;

etching the interlayer insulating film using the first to third silicon nitride films as a stopper to form a contact hole by etching; and forming a contact by laminating a conductive layer in the contact hole.

DETAILED DESCRIPTION OF THE EMBODIMENTS

Next, a semiconductor device according to an embodiment of the present invention is described with reference to drawings.

Configuration of Semiconductor Device According to First Embodiment

Figure 1:
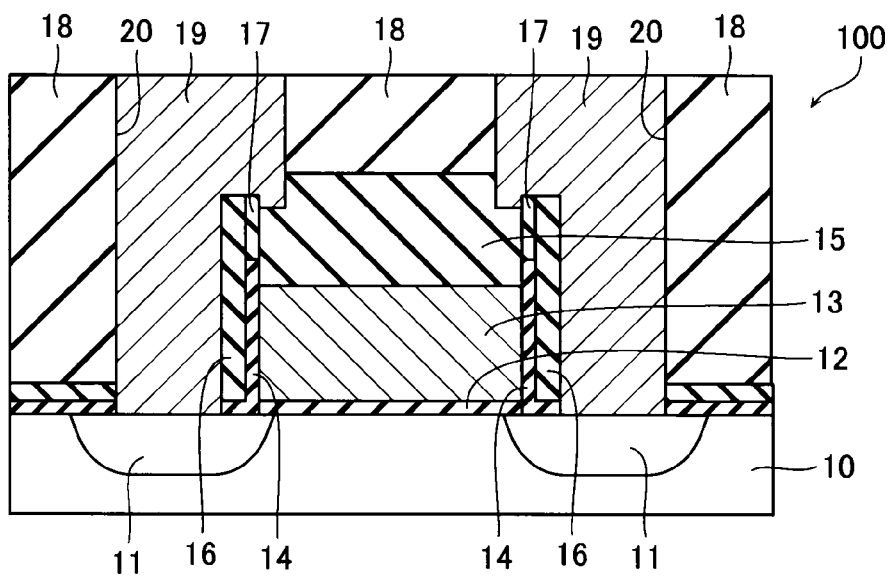
FIG. 1 is a sectional view of the semiconductor device 100 by one embodiment of this invention.

FIG. 1 is a partial sectional view of a semiconductor device 100 according to a first embodiment of the embodiment of the present invention.

As shown in FIG. 1, a semiconductor device 100 according to the present embodiment has a semiconductor substrate 10, a gate insulating film 12, a gate electrode 13, a protection insulating film 14, a first silicon nitride film 15, a second silicon nitride film 16, a third silicon nitride film 17, an interlayer insulating film 18, and contacts 19.

A plurality of impurity diffused regions 11 is formed on the semiconductor substrate 10. These regions 11 function as drain/source.

The gate insulating film 12 is formed on the surface of the semiconductor substrate 10. The gate electrode 13 is formed on the gate insulating film 12 between the impurity diffused regions 11. The protection insulating film 14 is formed of a silicon oxide film, for example, and is formed continuously on the semiconductor substrate 10 and on the side of the gate electrode 13.

The first silicon nitride film 15 is formed on the upper surface of the gate electrode 13 in a self-alignment manner. The third silicon nitride film 17 is formed on the upper surface of the protection insulating film 14. The second silicon nitride film 16 is formed on the side of the protection insulating film 14 and the third silicon nitride film 17. The interlayer insulating film 18 is formed, for example, of a silicon oxide film. The interlayer insulating film 18 is formed to bury the semiconductor device 100 and to cover the semiconductor substrate 10.

The contacts 19 penetrate through the interlayer insulating film 18 and the gate insulating film 12, and is formed on the impurity diffused regions 11. The contacts 19 are formed to extend along a vertical direction with respect to the semiconductor substrate 10. The contact hole 20 for forming contact 19 therein is formed by etching the interlayer insulating film 18 in a self-alignment manner, using the first silicon nitride film 15, the second silicon nitride film 16 and the third silicon nitride film 17 as a stopper. Therefore, a contact 19 is formed by laminating a conductive layer in the contact hole 20. In addition, the contact 19 is formed to contact with the first silicon nitride film 15, the second silicon nitride film 16, and the third silicon nitride film 17. Note that a self-alignment herein means a manufacturing process of a semiconductor integrated circuit in which a pattern formed in the previous process is utilized as a mask of the next process, and the next process is conducted without a mask alignment.

Figure 2:
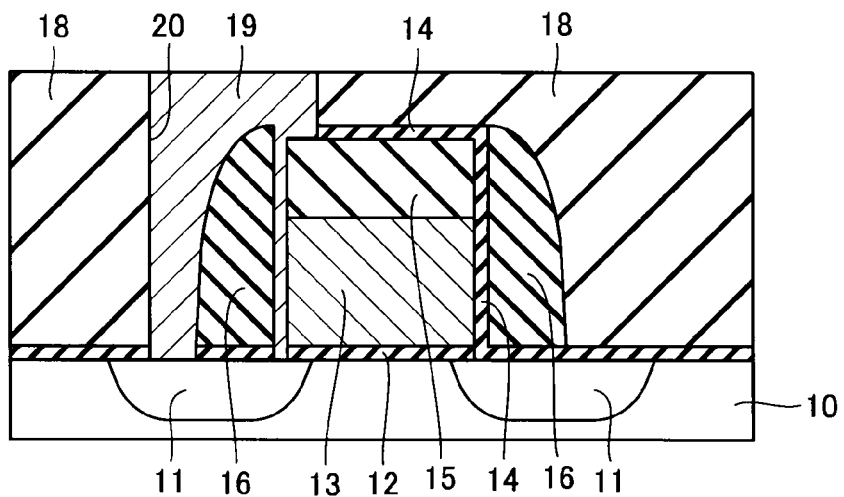
FIG. 2 is a partial sectional view of the semiconductor device with a structure in which a silicon nitride film is not formed on the upper surface of the protection insulating film.

FIG. 2 is a figure showing a structure in which the third silicon nitride film 17 is not formed on the top surface of the protection insulating film 14 that is formed on the side of the gate electrode 13. Note that, in FIG. 2, the same reference numerals are used for the same elements as the first embodiment. In the structure shown in FIG. 2, the protection insulating film 14 and the interlayer insulating film 18 is explained as being formed of an silicon oxide film, as an example.

In the structure shown in the right side of FIG. 2, the third silicon nitride film 17 is not formed on the upper surface of the protection insulating film 14. Thus, not only the interlayer insulating film 18 is etched, but also the protection insulating film 14 is etched, when contact 19 is formed in a self-alignment manner with respect to the gate electrode 13. Therefore, the contact 19 and the gate electrode 13 may be formed to be short-circuited to each other, as shown in the left side of FIG. 2.

In contrast, the semiconductor device 100 according to the first embodiment is formed such that the first to third silicon nitride films 15 to 17 each having an etching selection ratio with respect to the protection insulating film 14 cover the circumference of the protection insulating film 14. This prevents the protection insulating firm 14 from being etched, since the first to third silicon nitride films 15 to 17 serve as a stopper when the interlayer insulating film 18 is etched. Therefore, the semiconductor device 100 according to the first embodiment may form a small semiconductor device without short-circuiting the contact 19 and the gate electrode 13.

Also, the bottom of the third silicon nitride film 17 is formed in the upper part than the bottom of the first silicon nitride film 15, as shown in FIG. 1. Being formed in such a way, the silicon nitride film is not formed on the side of gate electrode 13, and only the protection insulating film 14 is formed thereon.

Figure 3:
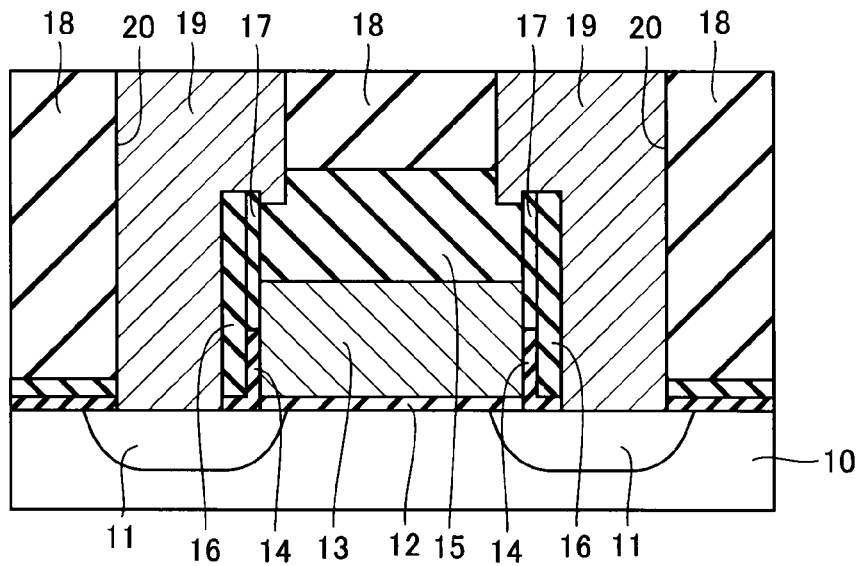
FIG. 3 is a partial sectional view of the semiconductor device having a structure in which a third silicon nitride film 17 is formed on the side of the gate electrode 13.

FIG. 3 is a figure showing a structure in which the third silicon nitride film 17 formed on the upper surface of the protection insulating film 14 is formed on the side of the gate electrode 13. Note that, in FIG. 3, the same reference numerals are assigned to the same elements as the first embodiment.

A silicon nitride film usually has a function of trapping electric charges. Thus, in the structure shown in FIG. 3, the third silicon nitride film 17 formed on the side of the gate electrode 13 may trap electric charges in the gate electrode 13. In addition, the structure shown in FIG. 3 has a small contact area between the protection insulating film 14 and the gate electrode 13. Therefore, it is inferior to the structure of the first embodiment in view of transistor properties thereof. Therefore, the semiconductor device 100 according to the first embodiment can improve the transistor properties than the structure shown in FIG. 3.

As described above, the contact 19 are formed in a self alignment manner with respect to the gate electrode 13. Therefore, the semiconductor device 100 according to the first embodiment may form a small semiconductor device 100. In addition, a silicon nitride film is suitably formed around the gate electrode 13 and the protection insulating film 14. This prevents the contact from being in contact with the gate electrode 13, and prevents the transistor properties thereof from being deteriorated.

Method of Manufacturing Semiconductor Device 100 According to First Embodiment Then, a method of manufacturing the semiconductor device 100 according to the first embodiment shown in FIG. 1 is described with reference to FIG. 1 and FIG. 4-FIG. 19. Note that, in this example, a self-alignment technique is explained as an example. Here, a pattern formed on the semiconductor substrate 10 is used as a mask.

Figure 4:
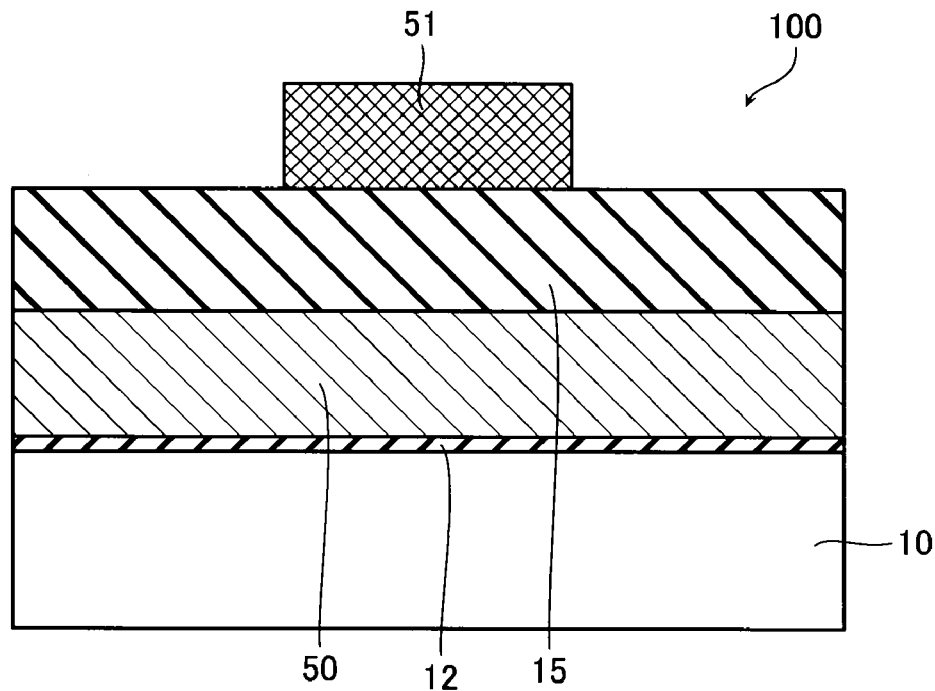
FIG. 4-FIG. 19 are figures showing a method of producing a semiconductor device 100 according to one embodiment of the present invention.

At first, the gate oxide film 12, a conductive layer 50 (a first conductive layer) as the gate electrode 13, and the first silicon nitride film 15 are sequentially laminated on the semiconductor substrate 10. In addition, a resist 51 having a shape of the gate is formed on the first silicon nitride film 15 (FIG. 4).

Figure 5:
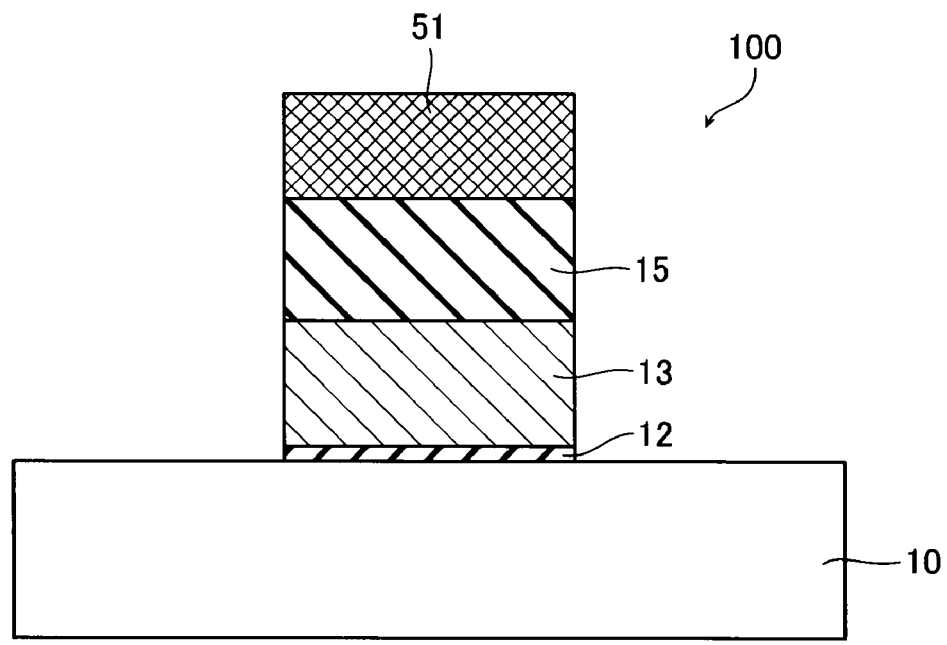

Then, the first silicon nitride film 15, the conductive layer 50, and the gate insulating film 12 are etched using the resist 51 as a mask, to form a pattern of the first silicon nitride film 15, the gate electrode 13 and the gate insulating film 12 (FIG. 5). Therefore, the first silicon nitride film 15 is formed on the upper surface of the gate electrode 13.

Figure 6:
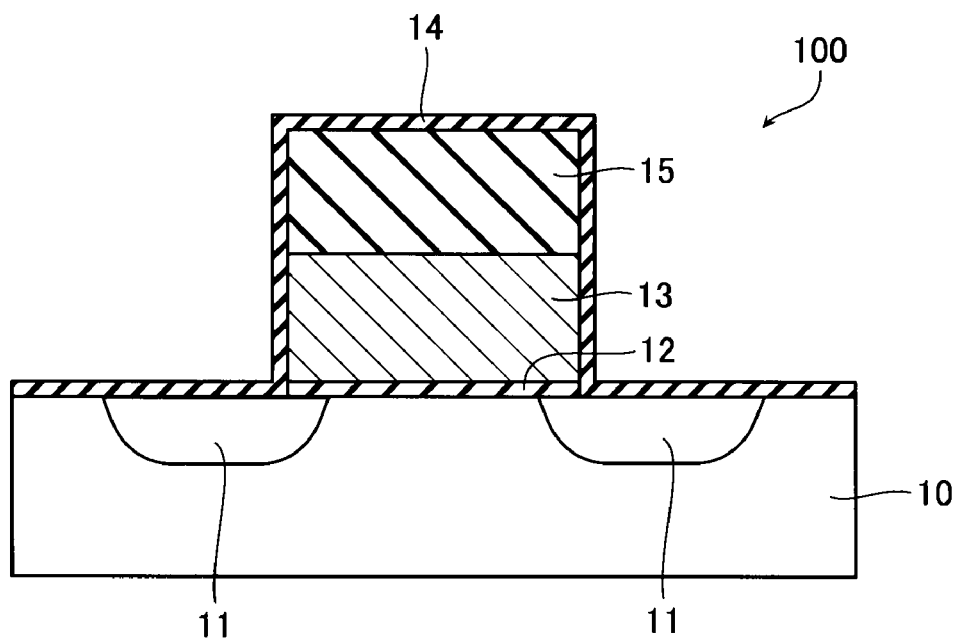

Next, after removing the resist 51, the protection insulating film 14 is laminated on the semiconductor substrate 10 for protecting the gate electrode 13. Then, the impurity diffused region 11 is formed by the ion implantation method using the gate electrode 13 and the protection insulating film 14 as a mask (FIG. 6).

For example, the protection insulating film 14 is formed by a CVD (Chemical Vapor Deposition) method or an ISSG (In-Situ Steam Generation) oxidation method. It is preferable that the protection insulating film 14 is formed of a silicon oxide film because it hardly traps electric charges. Note that the CVD method make object material to deposit on a semiconductor substrate using gas produced by chemical reaction. The ISSG oxidation method conducts an oxidation method using radical oxygen as a main oxidation source to grow an ultra-thin gate insulating film.

Figure 7:
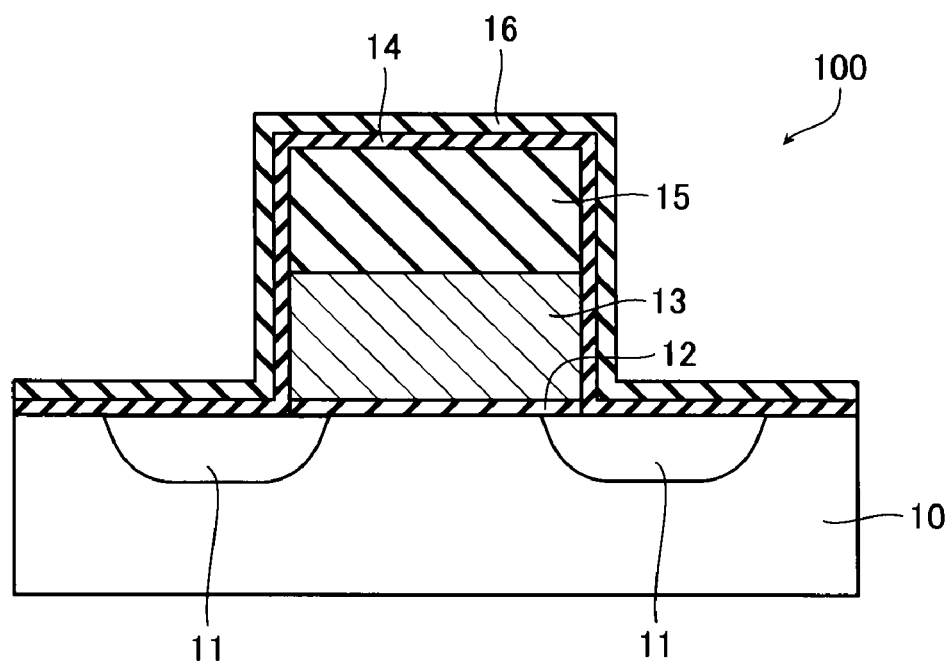
Figure 8:
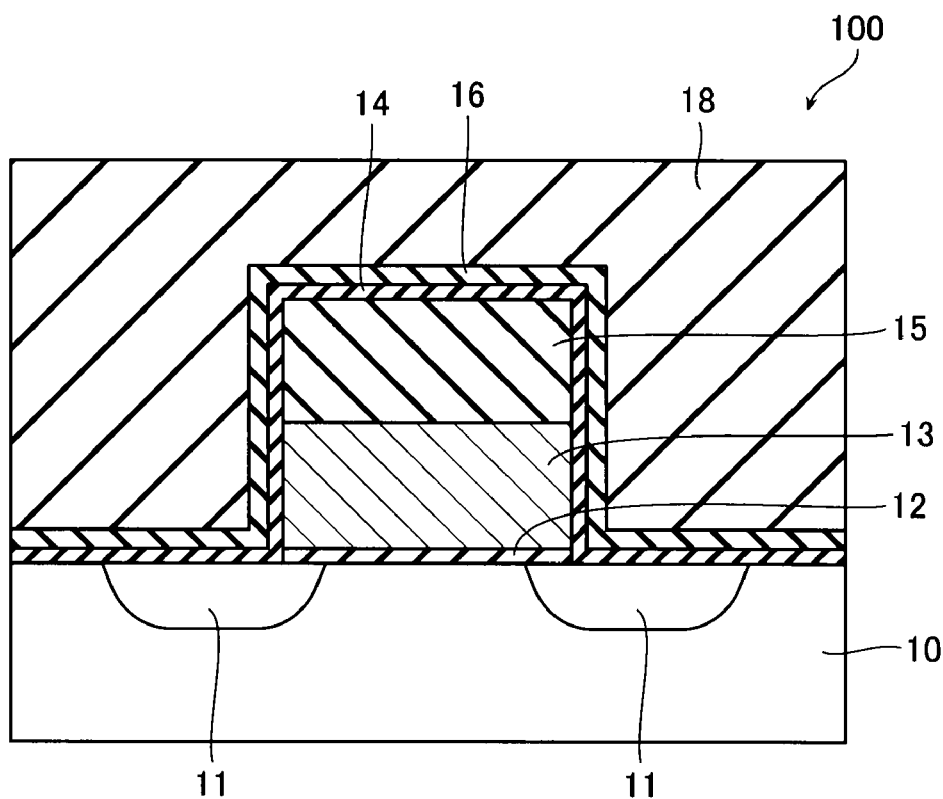

Subsequently, the second silicon nitride film 16 is formed on the protection insulating film 14 using the CVD method (FIG. 7). Thereafter, the interlayer insulating film 18 formed of an silicion oxide film, for example, is deposited on the entire surface of the semiconductor substrate 10 using the CVD method or the like (FIG. 8). Note that, instead of forming the interlayer insulating film 18 to fill gaps in the semiconductor device 100, a spacer insulating film (not shown) formed around peripheral-circuit transistors (not shown) may be deposited. As a result, the semiconductor device 100 may be buried in a step of forming the spacer insulating film of the peripheral-circuit transistors, thereby some processes may be omitted.

Figure 9:
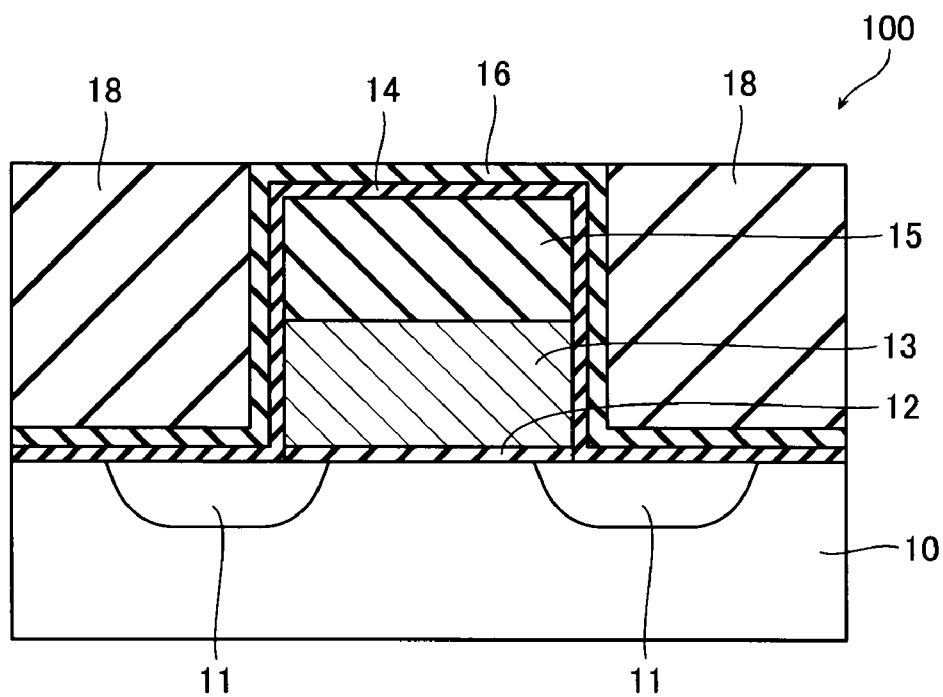

Thereafter, the interlayer insulating film 18 is etched using anisotropic etching. This process exposes the upper surface of the second silicon nitride film 16 formed on the upper part of the first silicon nitride film 15 (FIG. 9).

Figure 10:
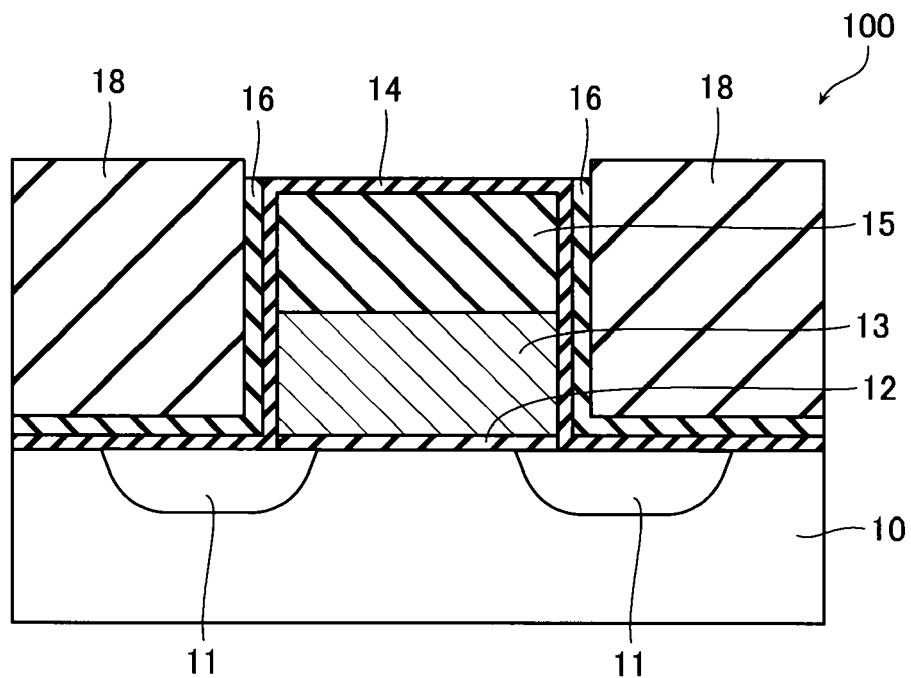

In addition, using anisotropic etching, the second silicon nitride film 16 formed on the upper part of the first silicon nitride film 15 is etched (FIG. 10).

Figure 11:
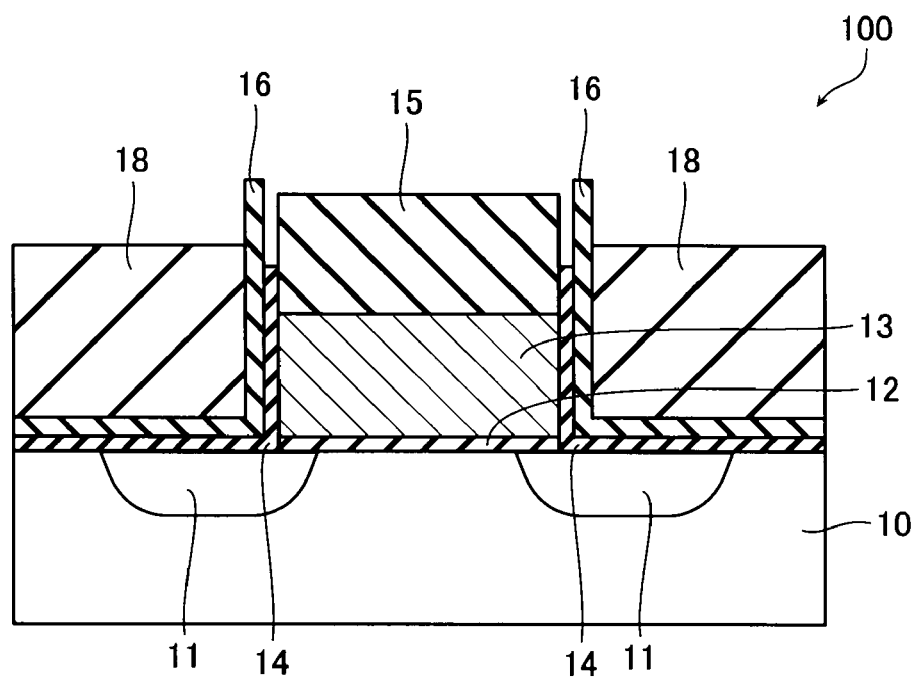

Furthermore, using anisotropic etching, the protection insulating film 14 formed on the upper part of the first silicon nitride film 15 is etched. Then, etching is performed until the upper surface of the protection insulating film 14 formed on the sidewall of the first silicon nitride film 15 is positioned between the upper surface and the bottom surface of the first silicon nitride film 15 (FIG. 11). Also, the interlayer insulating film 18 is etched at the same time. Note that, the upper surface of the protection insulating film 14 formed on the sidewall of the first silicon nitride film 15, is positioned in the upper part than a bottom of the first silicon nitride film 15, at least. In addition, the quantity of ething of the protection insulating film 14 formed on the sidewall of the first silicon nitride film 15 may be adjusted by the etching time thereof. In this embodiment, the quantity of etching is controlled such that the upper surface of the protection insulating film 14 is positioned in the vicinity of the midpoint of the first silicon nitride film 15.

Figure 12:
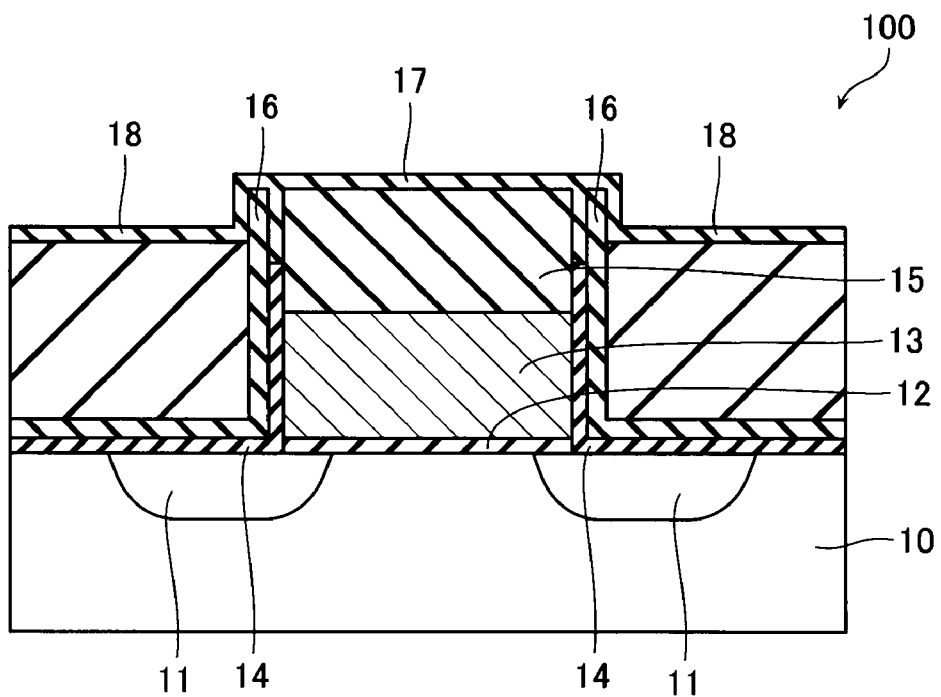

Then, the third silicon nitride film 17 is deposited using the CVD method (FIG. 12). Note that the third silicon nitride film 17 is embedded in the gap formed between the first silicon nitride film 15 and the second silicon nitride film 16 through this process.

Figure 13:
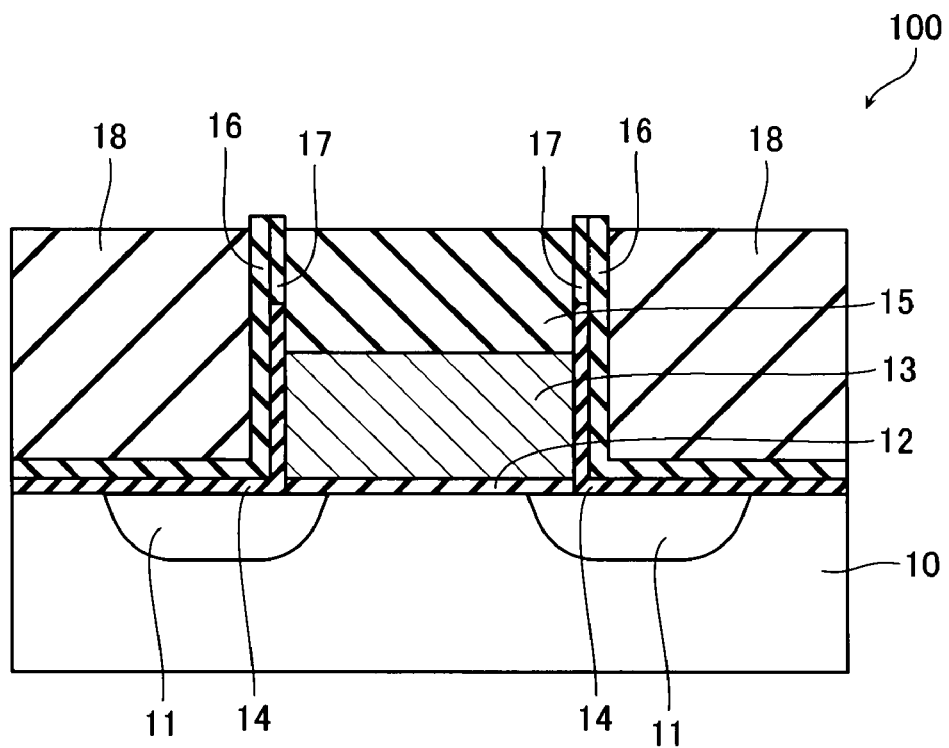

Next, the third silicon nitride film 17 formed on the upper part of protection insulating film 14, the interlayer insulating film 18 and the first silicon nitride film 15 is etched by anisotropic etching (FIG. 13). In this process, the third silicon nitride film 17 formed on the protection insulating film 14 is not completely removed, but an upper part thereof is partly removed.

Figure 14:
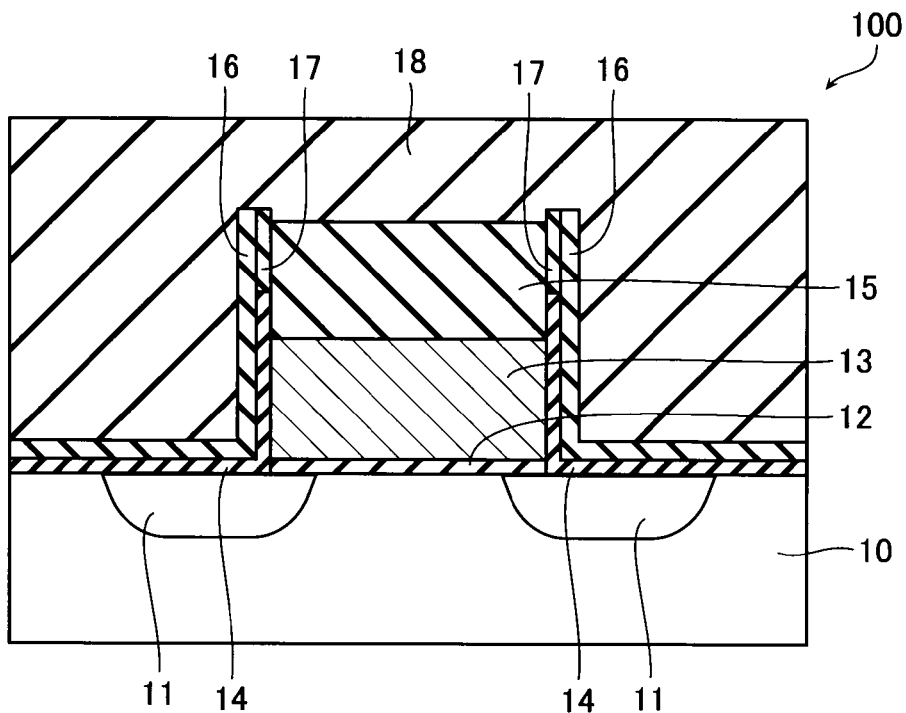
Figure 15:
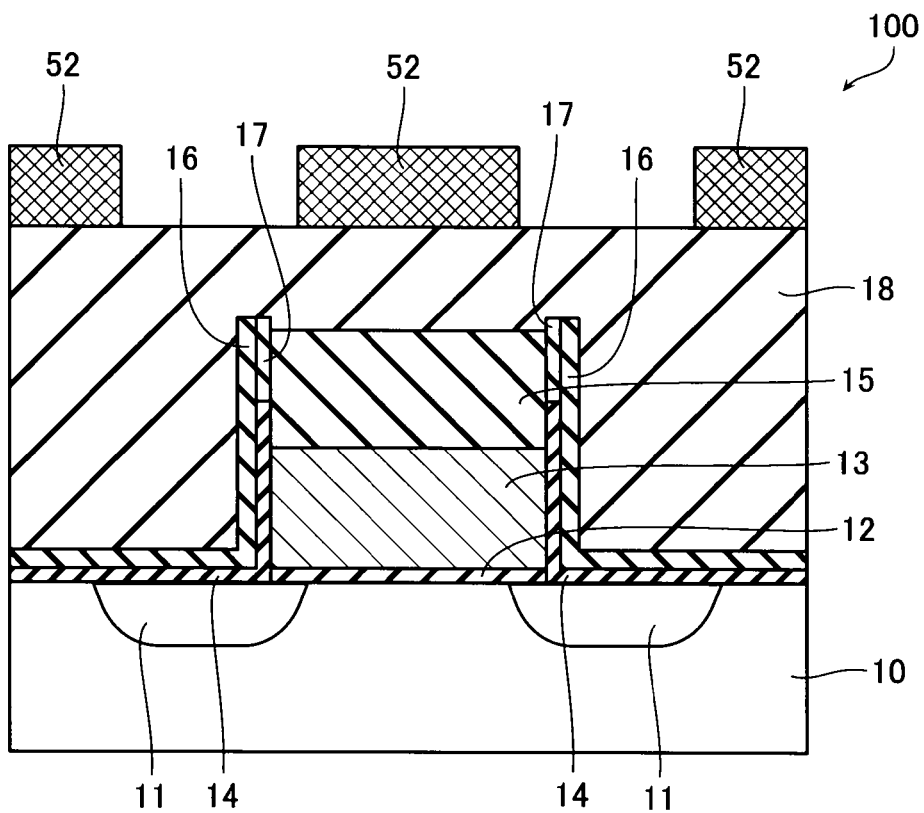

Thereafter, the interlayer insulating film 18 is further deposited using a CVD method or the like (FIG. 14). In this process, it is also possible that the interlayer insulating film 18 is formed of a different material from the lower interlayer insulating film. In addition, a resist 52 for forming a contact hole 20 for the contact 19 is formed on the interlayer insulating film 18 (FIG. 15).

Figure 16:
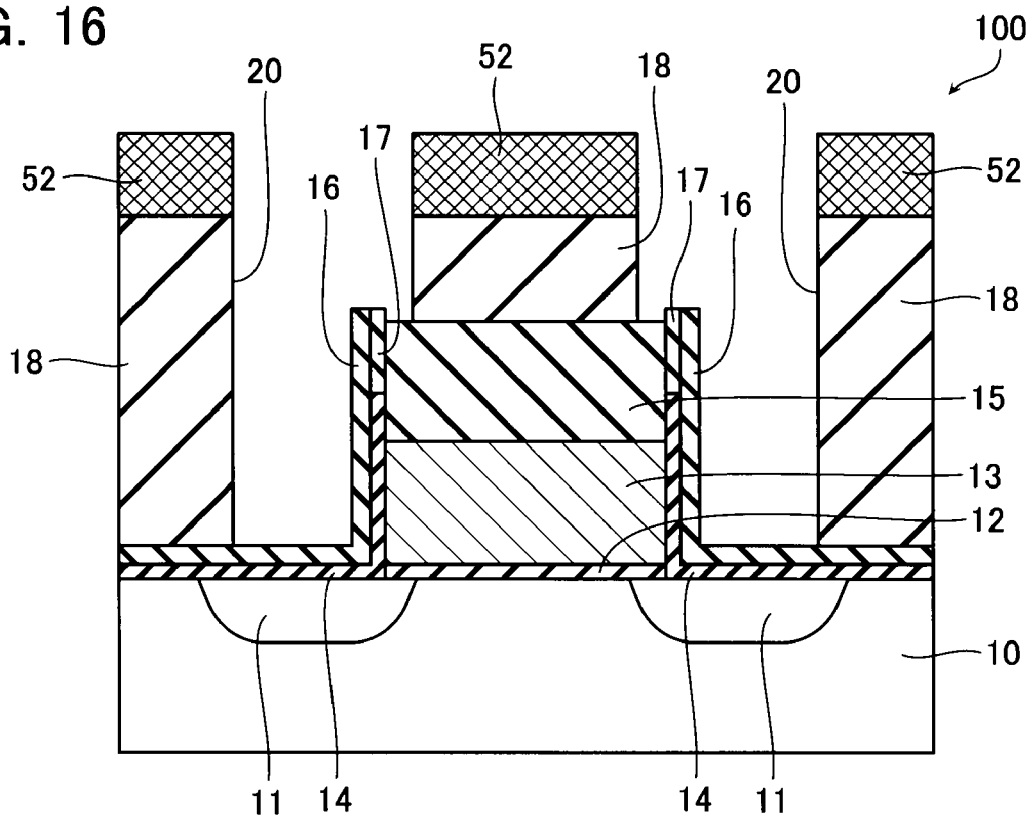

Next, the interlayer insulating film 18 is etched using the resist 52 as a mask by anisotropic etching to form a contact hole 20 (FIG. 16). In this process, the contact hole 20 is formed without the protection insulating film 14 being etched. This is because the first to third silicon nitride films 15 to 17 serve as a stopper.

Figure 17:
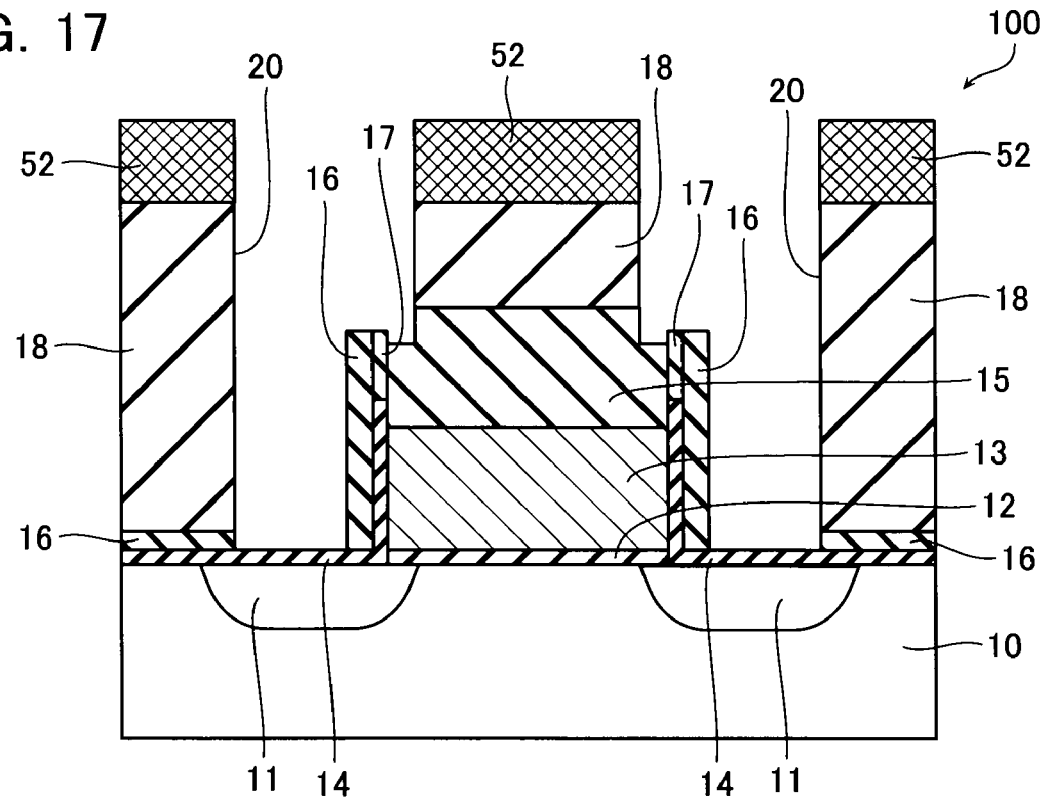
Figure 18:
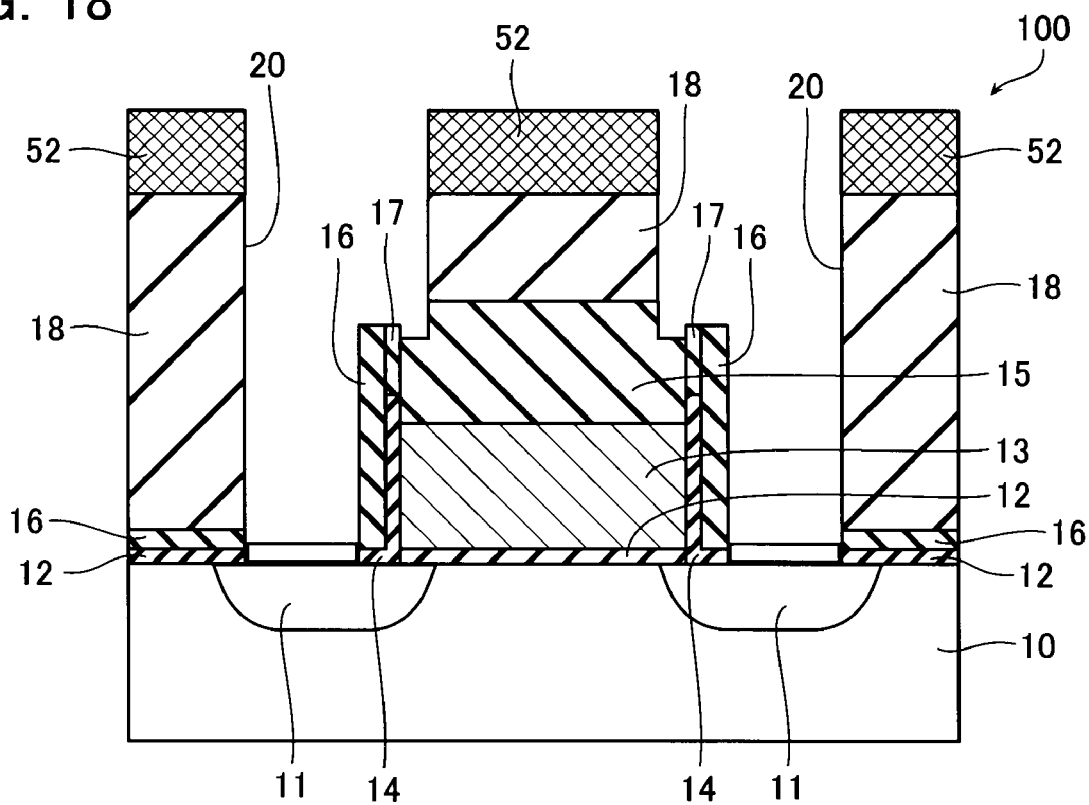
Figure 19:
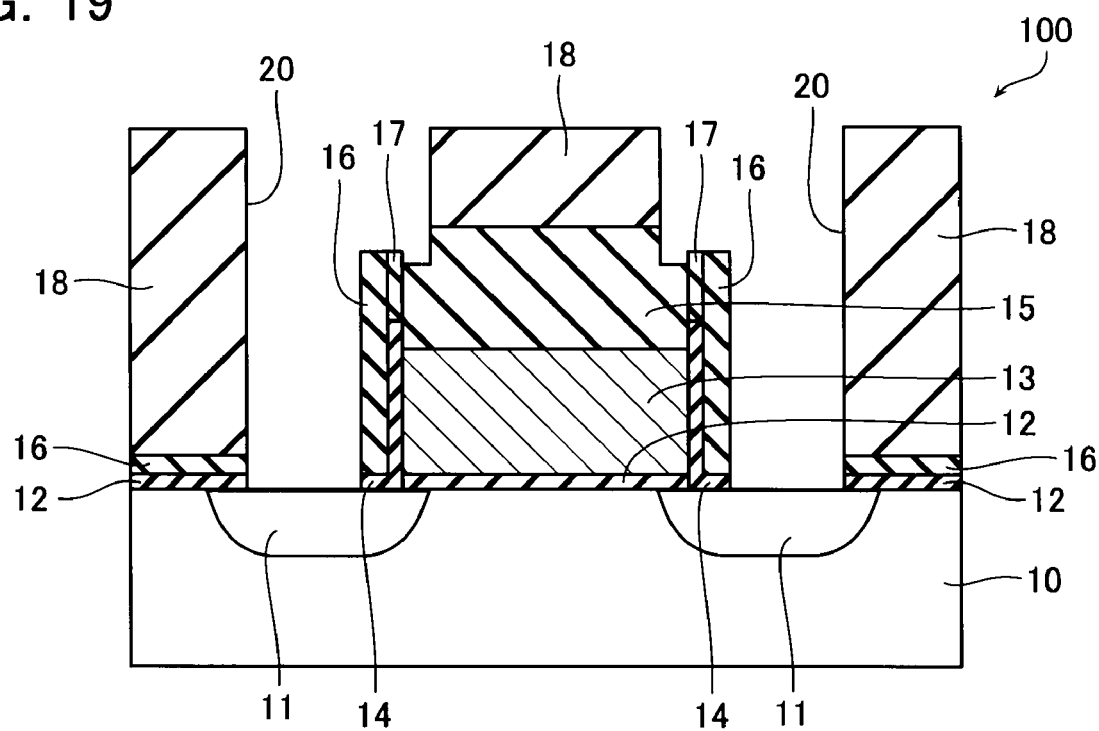

Next, the second silicon nitride film 16 formed at a bottom of the contact hole 20 is etched using anisotropic etching (FIG. 17). Then the protection insulating film 14 formed at the bottom of the contact hole 20 is etched using anisotropic etching (FIG. 18). In addition, the resist 52 is removed (FIG. 19). Then, a conductive layer is deposited in the contact hole 20, to form the contact 19 (FIG. 1).

Configuration of Semiconductor Device 200 According to Second Embodiment

Figure 20A:
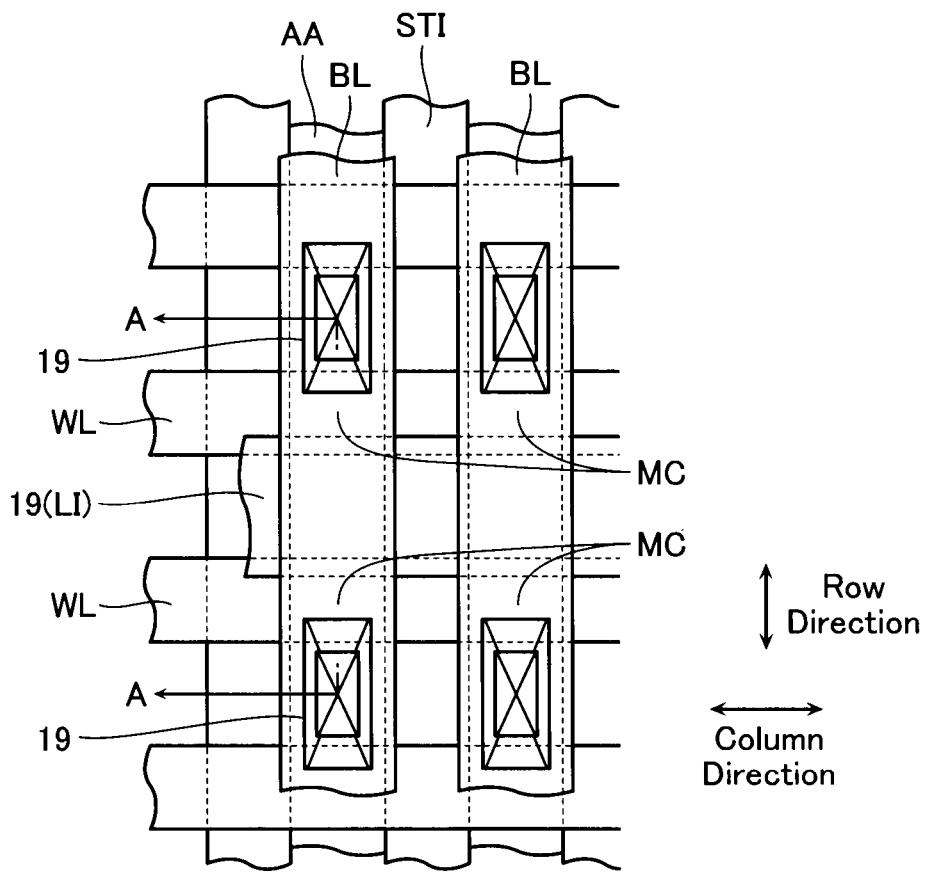
FIG. 20A is a plan view of the semiconductor device 200 according to the second embodiment.
Figure 20B:
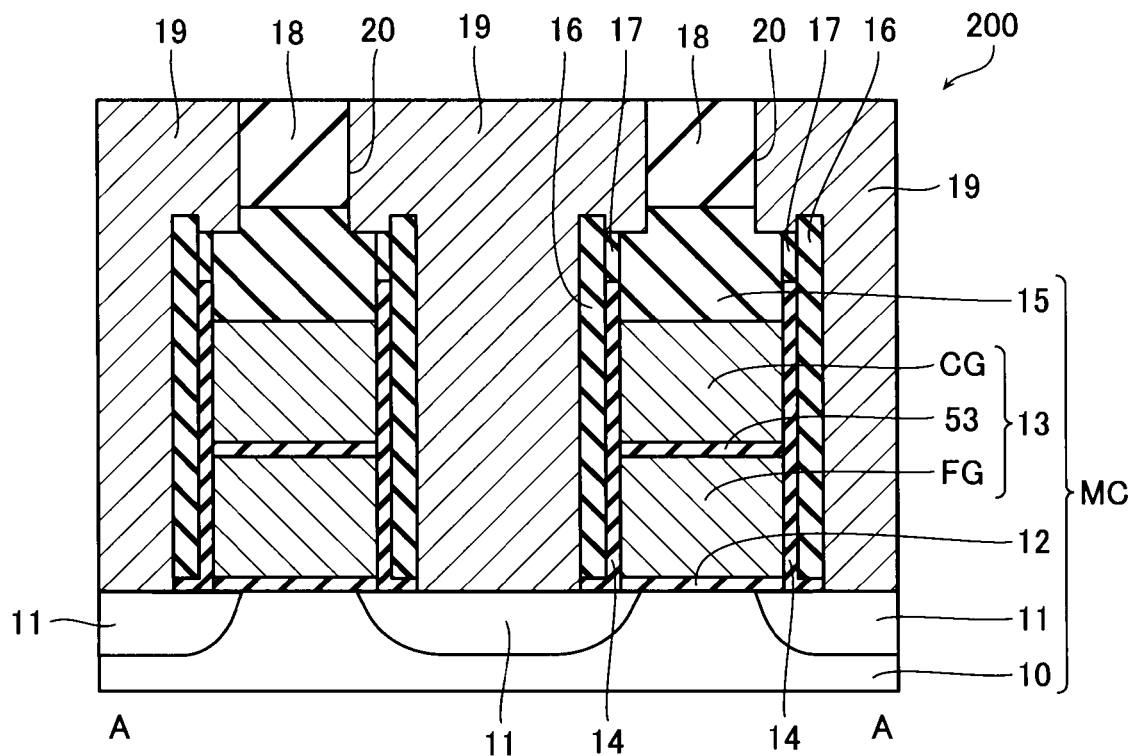
FIG. 20B is a partial sectional view of the semiconductor device 200 according to the second embodiment.

FIG. 20A, FIG. 20B are a partial plan view and a sectional view of the semiconductor device 200 according to the second embodiment, respectively. This second embodiment is an example in which the present invention is applied to an NOR-type flash memory. Note that FIG. 20B shows a sectional view taken along the A-A line in FIG. 20A. In FIG. 20B, the same reference numerals are assigned to the equivalent elements of the first embodiment. The explanation on the elements same as the first embodiment is omitted hereinbelow.

As shown in FIG. 20A, this semiconductor device 200 comprises an element formation region (an active region) AA formed along a column direction as a longitudinal direction on the semiconductor substrate 10, and an element isolation region (an element isolation insulating film) STI formed along a column direction as a longitudinal direction. This element isolation region STI serves to isolate the element formation region AA.

The above-mentioned NOR type flash memory is formed in the element formation region AA. Word lines WL are formed to extend along the row direction, and are connected to control gates CG of the memory transistor MC.

Bit lines BL are formed to extend along the column direction, and are connected to the drain terminal of the memory transistor MC.

Also in this embodiment, the contact 19 is formed so as to be connected to the impurity diffused region 11 (FIG. 20B). The contact 19 in this embodiment includes a local interconnect LI for connecting source terminals of the plural memory cell transistors MC arranged along the row direction, and a contact plug CG for connecting drain terminals of the memory cell transistors MC and bit lines BL.

As shown in FIG. 20B, the gate electrode 13 comprises a floating gate electrode FG formed on the semiconductor substrate 10, and a control gate electrode CG formed on the floating gate electrode FG via an insulating film 53. The configuration of the second embodiment is different from that of the first embodiment in the above-described part, and the other parts are the same as the first embodiment. Note that the semiconductor device 200 according to the second embodiment is called a NOR type flash memory 200 hereinbelow.

The inter-gate insulating film 53 is formed of an silicon oxide film, of an ON film, a NO film, or an ONO film, which is a laminated-layer structure of a silicon oxide film and an silicon nitride film.

As shown in FIG. 20B, the NOR type flash memory 200 according to the second embodiment is formed such that the first to third first silicon nitride films 15-17 having a selection ratio with respect to the protection insulating film 14 are formed to surround the circumference of the protection insulating film 14. This prevents the protection insulating film 14 from being etched when the interlayer insulating film 18 is etched, because the first to third silicon nitride films 15-17 serve as a stopper. Therefore, the NOR type flash memory 200 according to the second embodiment may form a small NOR type flash memory 200 without short-circuiting the contact 19 and the gate electrode 13.

Also, as shown in FIG. 20B, the bottom of the third silicon nitride film 17 is formed in a higher portion than the bottom of the first silicon nitride film 15. Being formed in this way, a silicon nitride film is not formed on the side of the floating gate electrode FG and the control gate electrode CG, but only the protection insulating film 14 is formed thereon. In this regard, it is the same as the configuration of the first embodiment.

Figure 21:
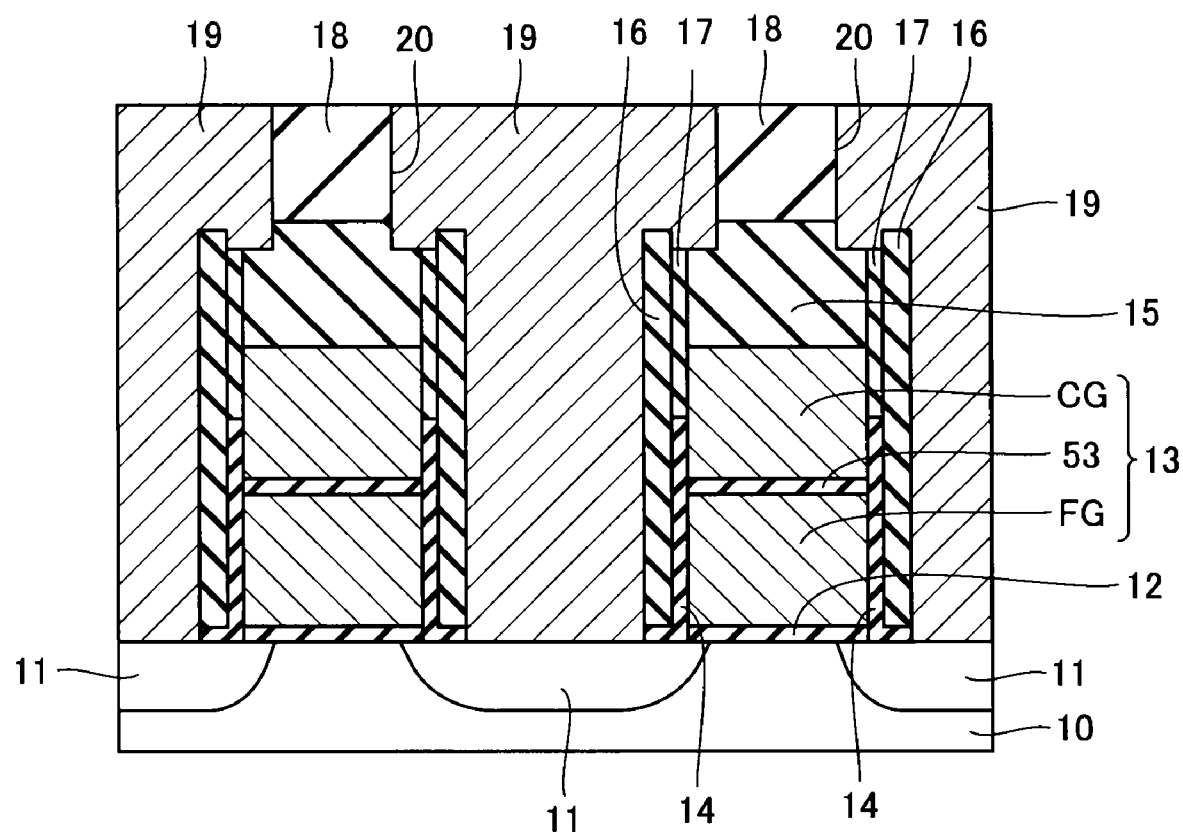
FIG. 21 is a partial sectional view of the flash memory having a structure in which a third silicon nitride film 17 is formed on the side of the gate electrode 13.

FIG. 21 is a figure showing a structure in which the third silicon nitride film 17 formed in the upper surface of the protection insulating film 14 is also formed on the side of the control gate electrode CG. Note that, in FIG. 21, the same numerals are assigned to the same elements as the second embodiment.

Generally speaking, characteristic of a flash memory is determined by a capacitance ratio of C1:C2—where C1 is a capacitance between the semiconductor substrate and the floating gate electrode, while C2 is a capacitance between the floating gate electrode and the control gate electrode (this ratio is referred to as "a coupling ratio" hereinbelow).

It is necessary to obtain a high coupling ratio to improve a characteristic of the flash memory. Also, a capacitance C3 between adjacent memory cells relates to the coupling ratio, and the coupling ratio improves if the capacitance C3 is small. The Capacitance C3 may be set small, by forming a silicon oxide film on the side of the control gate CG, rather than forming a silicon nitride film thereon.

Therefore, a structure of the NOR type flash memory 200 according to second embodiment as shown in FIG. 20B may obtain a higher coupling ratio than that shown in FIG. 21.

As explained above, the NOR type flash memory 200 according to the second embodiment can be small, because the contact 19 is formed in a self-alignment manner with respect to the floating gate electrode FG and the control gate electrode CG.

In addition, since a silicon nitride film is suitably disposed around the floating gate electrode FG, the control gate electrode CG and the protection insulating film 14. This prevents the contact 19 from contanting the floating gate electrode FG and the control gate CG, and the coupling ratio from being deteriorated.

Method of Manufacturing Semiconductor Device 200 According to Second Embodiment

Next, a method of manufacturing a semiconductor device 200 according to the second embodiment shown in FIG. 20 is described using FIGS. 20 and 22-FIG. 37. Note that in this explanation, a self-alignment technique is explained as an example that uses a pattern formed on the semiconductor substrate 10 as a mask.

Figure 22:
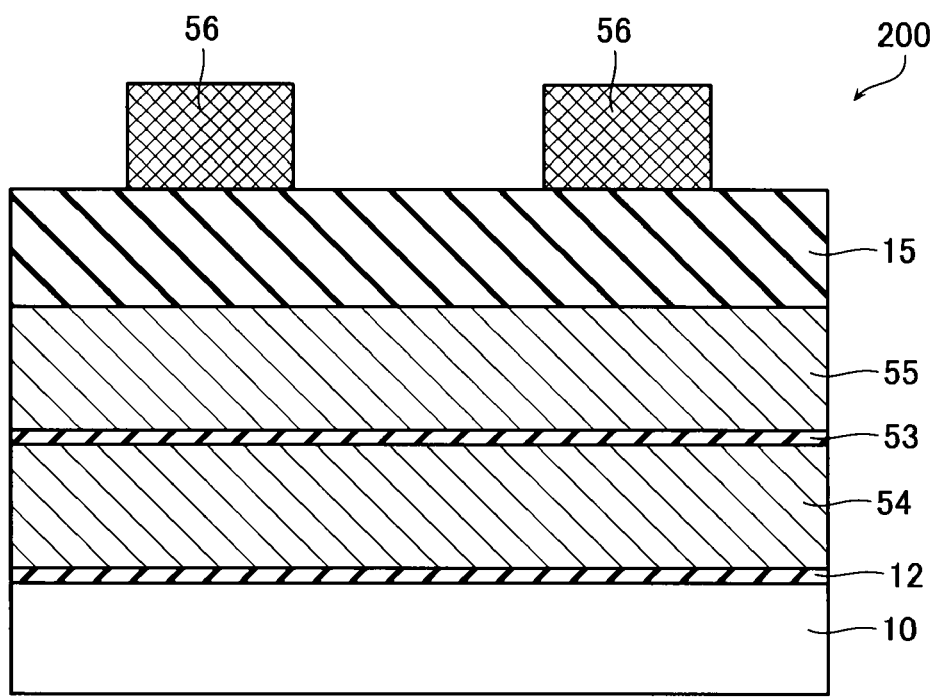
FIG. 22-FIG. 37 show a method of producing a semiconductor device 200 according to the second embodiment.

At first, the gate insulating film 12, a conductive layer 54 (the second electrically conductive layer) as the floating gate electrode FG, the inter-gate insulating film 53, a conductive layer 55 (the third conductive layer) as the control gate electrode CG, a first silicon nitride film 15 are laminated on the semiconductor substrate 10 sequentially, and a gate pattern-shaped resist 56 is formed on the first silicon nitride film 15 (FIG. 22).

Figure 23:
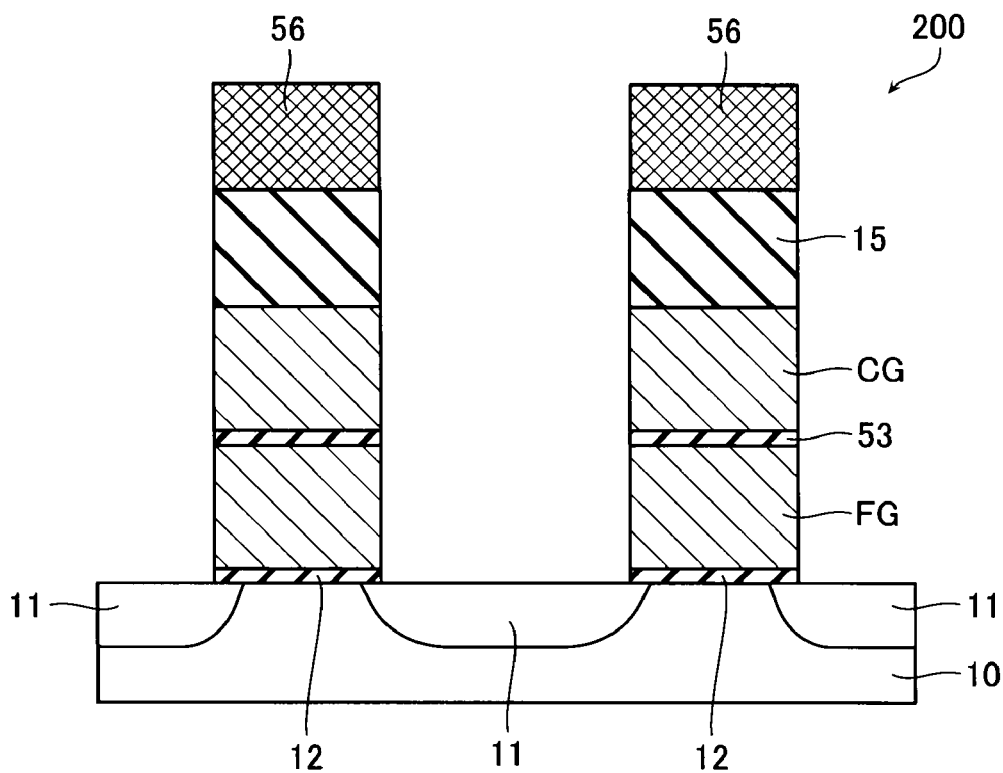

Then, with a resist 56 as a mask, the first silicon nitride film 15, the conductive layer 55, the inter-gate insulating film 53, the conductive layer 54, the gate insulating film 12 are etched to form a pattern of the first silicon nitride film 15, the control gate electrode CG, the inter-gate insulating film 53, the floating gate electrode FG, and the gate insulating film 12 (FIG. 23). Therefore, the first silicon nitride film 15 is formed on the upper surface of the control gate electrode CG.

Figure 24:
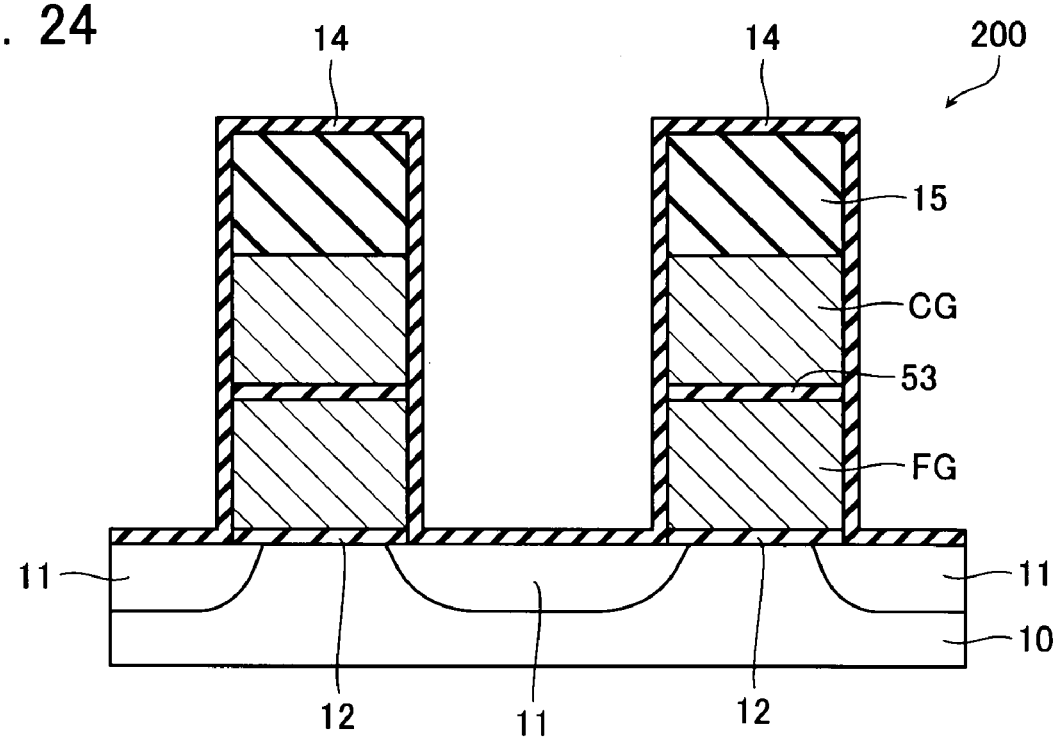

Then, after the resist 56 is removed, the protection insulating film 14 is laminated on the semiconductor substrate 10 to protect the floating gate electrode FG and the control gate electrode CG (FIG. 24). For example, the protection insulating film 14 is formed by a CVD method or the ISSG oxidation method.

Figure 25:
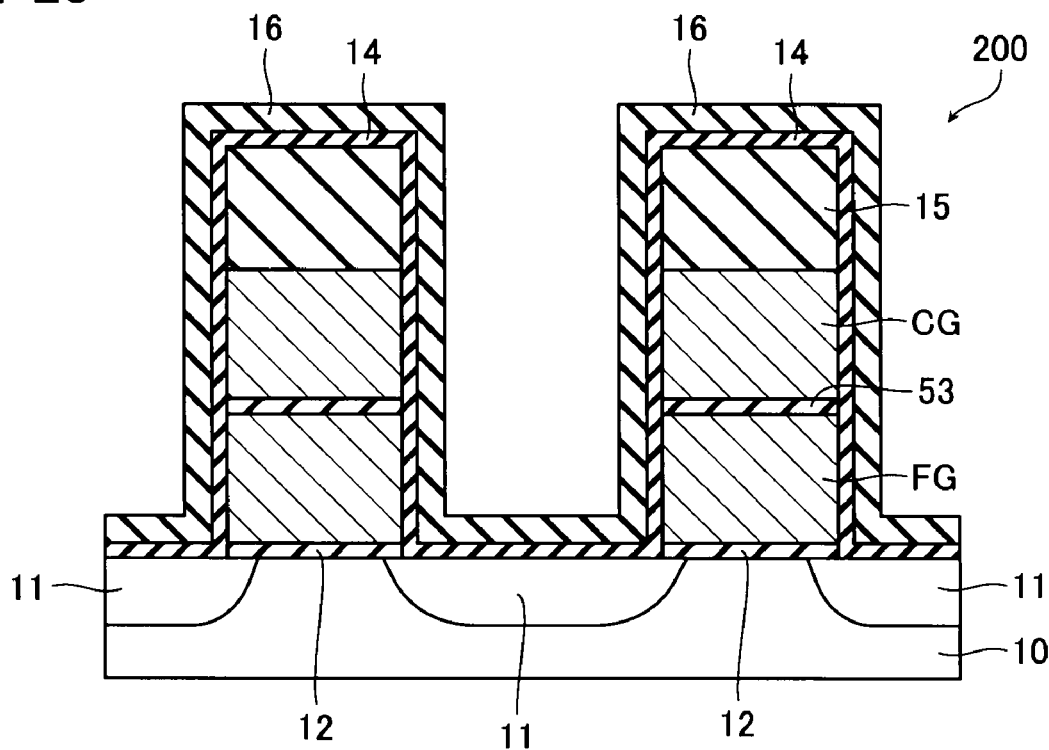

Subsequently, the second silicon nitride film 16 is formed on the protection insulating film 14 using the CVD method or the like (FIG. 25).

Figure 26:
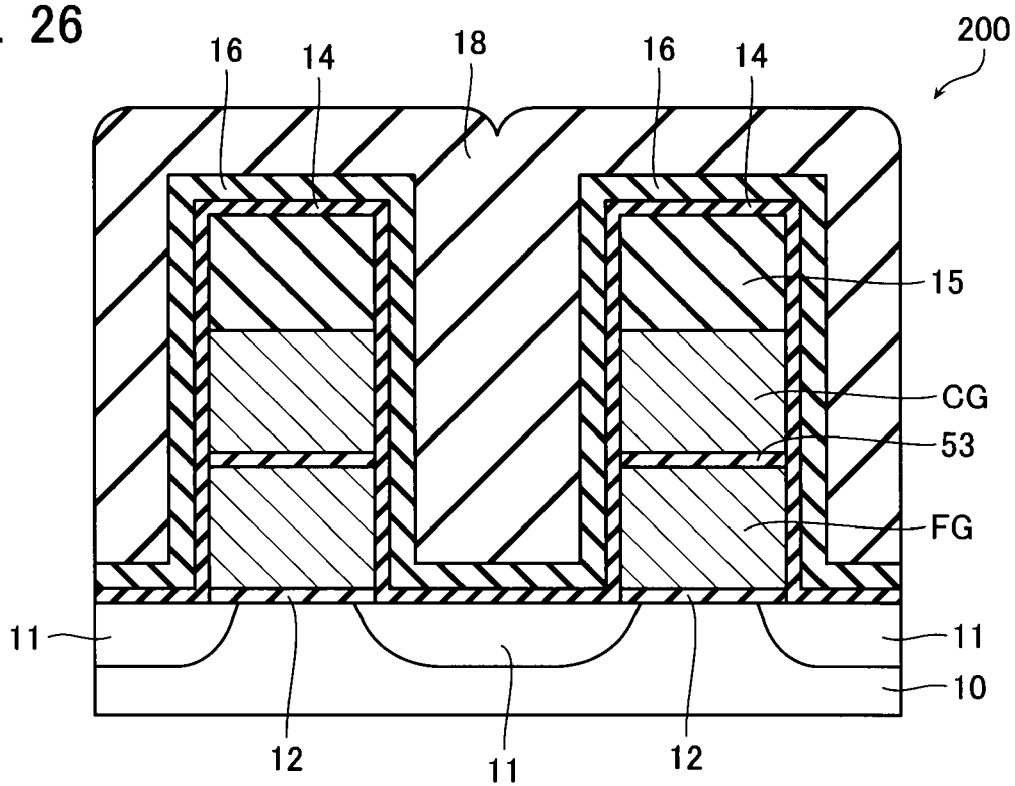

Thereafter, the interlayer insulating film 18 is deposited on the entire surface of the semiconductor substrate 10 using the CVD method or the like to bury the gap between the between the gate electrodes (FIG. 26). Note that, instead of forming the interlayer insulating film 18, a spacer insulating film (not shown) formed around the peripheral-circuit transistors (not shown) may be deposited to bury the gap between the between the gate electrodes.

Figure 27:
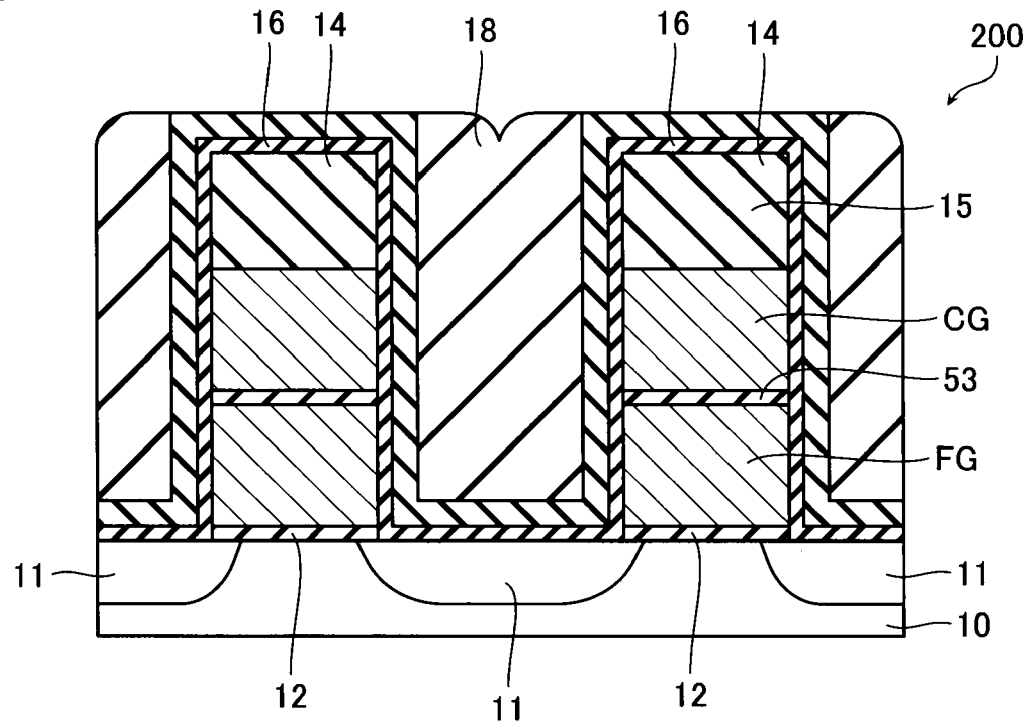

Furthermore, the interlayer insulating film 18 is etched using anisotropic etching, to expose the second silicon nitride film 16 formed on the upper part of the first silicon nitride film 15 (FIG. 27).

Figure 28:
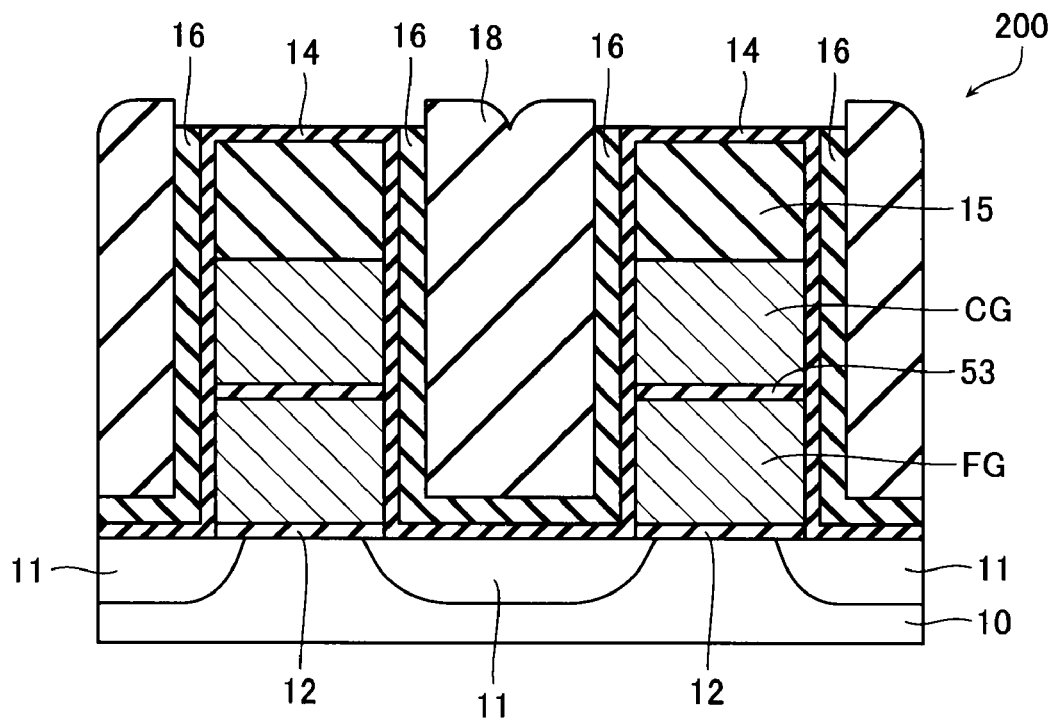

Then, the second silicon nitride film 16 formed on the upper part of the first silicon nitride film 15 is etched using anisotropic etching (FIG. 28). Thereafter, the protection insulating film 14 formed on the upper part of the first silicon nitride film 15 is etched using anisotropic etching.

Figure 29:
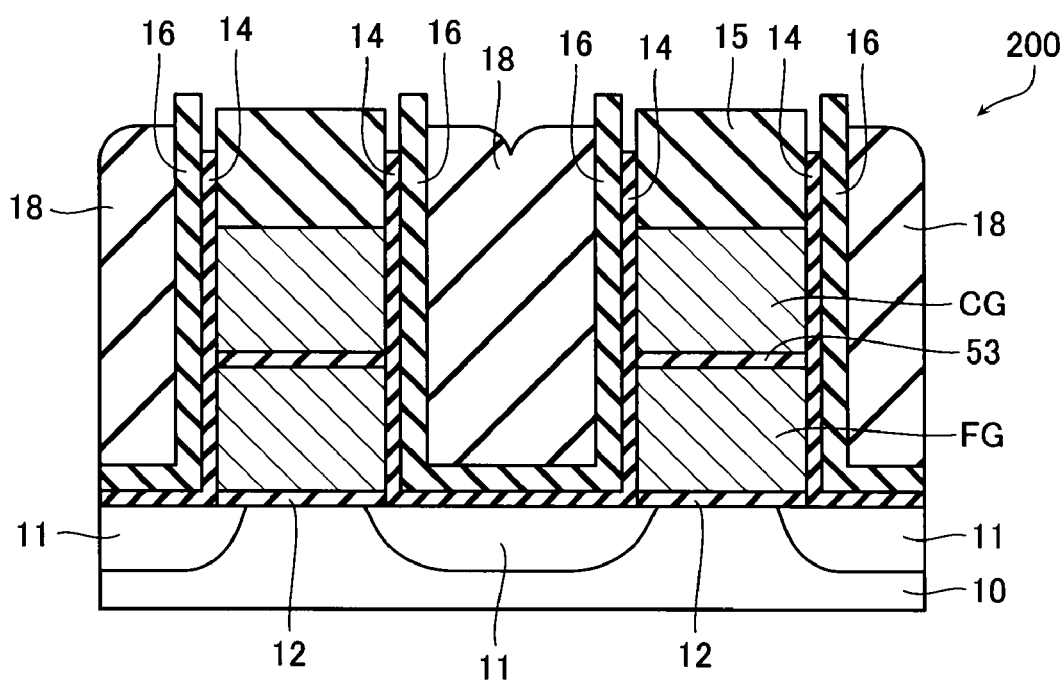

Also, the upper surface of the protection insulating film 14 formed on a sidewall of the first silicon nitride film 15 is etched until the upper surface thereof is positioned between the upper surface and the bottom surface of the first silicon nitride film 15 (FIG. 29). In this process, the interlayer insulating film 18 is also etched. Note that, the upper surface of the protection insulating film 14 formed on the sidewall of the first silicon nitride film 15 is positioned in a higher part than the bottom of the first silicon nitride film 15.

In addition, the quantity of etching of the protection insulating film 14 formed on the sidewall of the first silicon nitride film 15 may be adjusted by the etching time thereof. In this embodiment, the quantity of etching is controlled such that the upper surface of the protection insulating film 14 is positioned in the vicinity of the midpoint of the first silicon nitride film 15.

Figure 30:
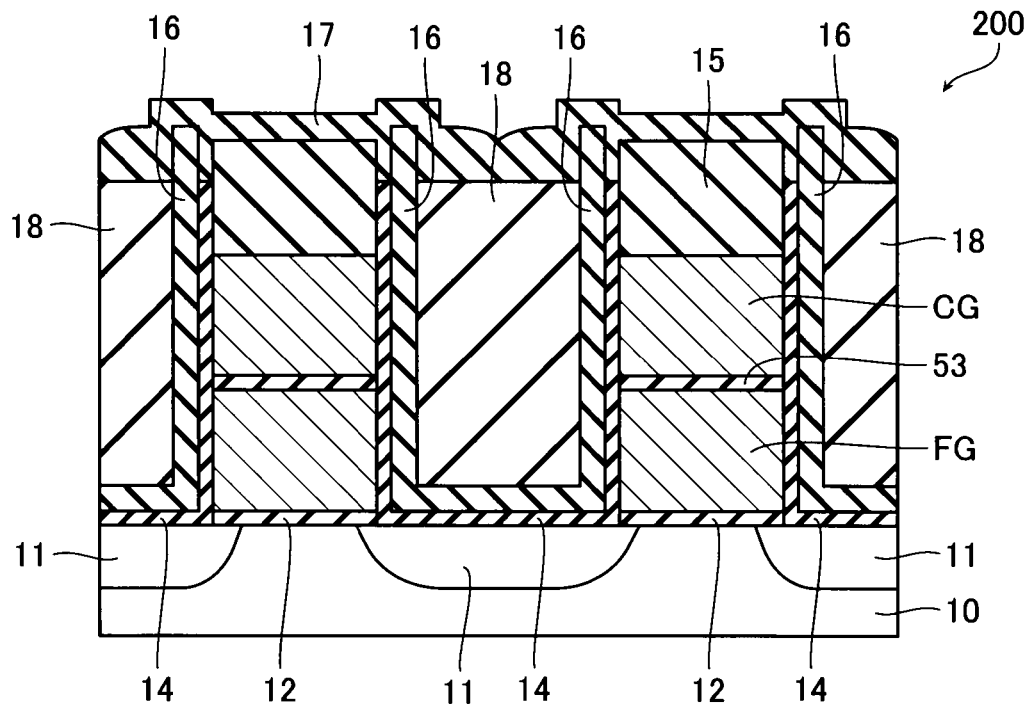

Next, the third silicon nitride film 17 is deposited using the CVD method (FIG. 30). Note that, the third silicon nitride film 17 is embedded in the gap formed between the first silicon nitride film 15 and the second silicon nitride film 16 during this process.

Figure 31:
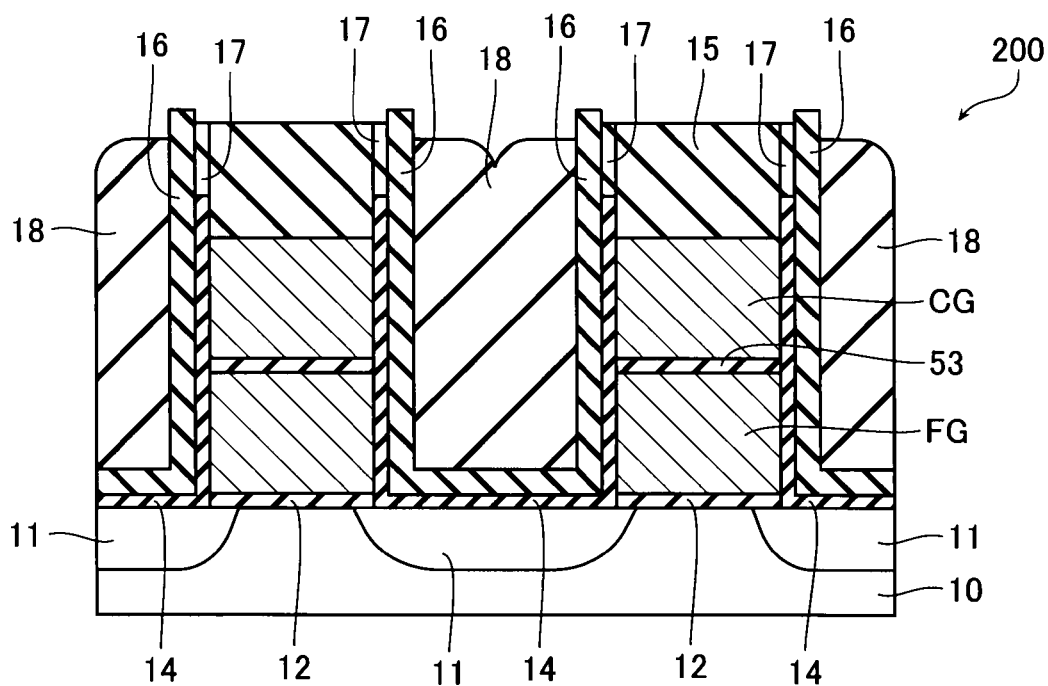

Thereafter, the third silicon nitride film 17 formed on the upper part of the protection insulating film 14, the interlayer insulating film 18 and the first silicon nitride film 15 is etched using anisotropic etching (FIG. 31). In this process, the third silicon nitride film 17 formed on the protection insulating film 14 is not completely removed, but only an upper part thereof is partly removed.

Figure 32:
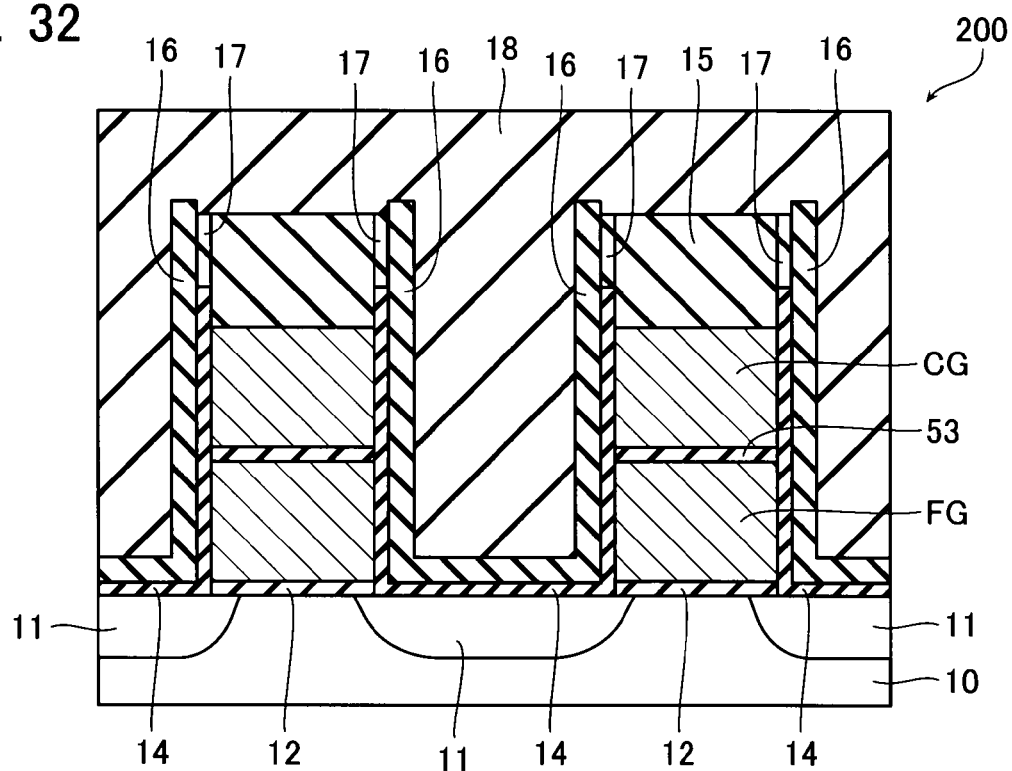
Figure 33:
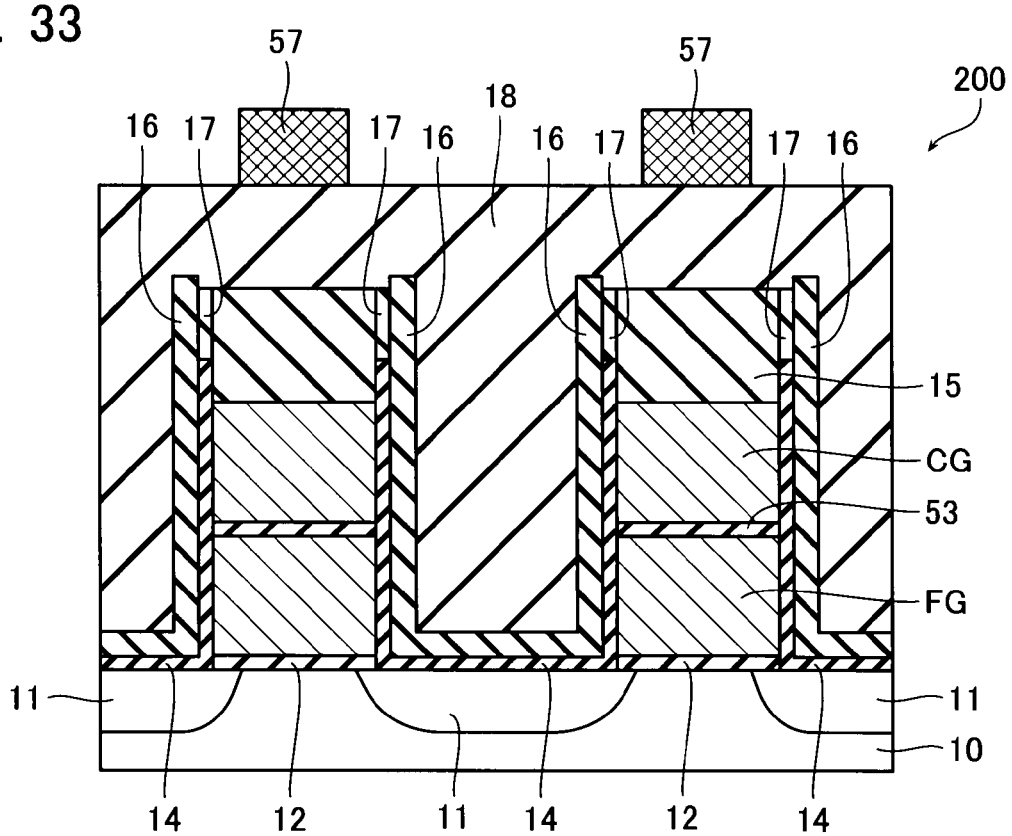

In addition, the interlayer insulating film 18 is further deposited using the CVD method or the like (FIG. 32). Furthermore, a resist 56 is formed on the interlayer insulating film 18 that has a shape of the contact hole 20 for the contact 19 (FIG. 33).

Figure 34:
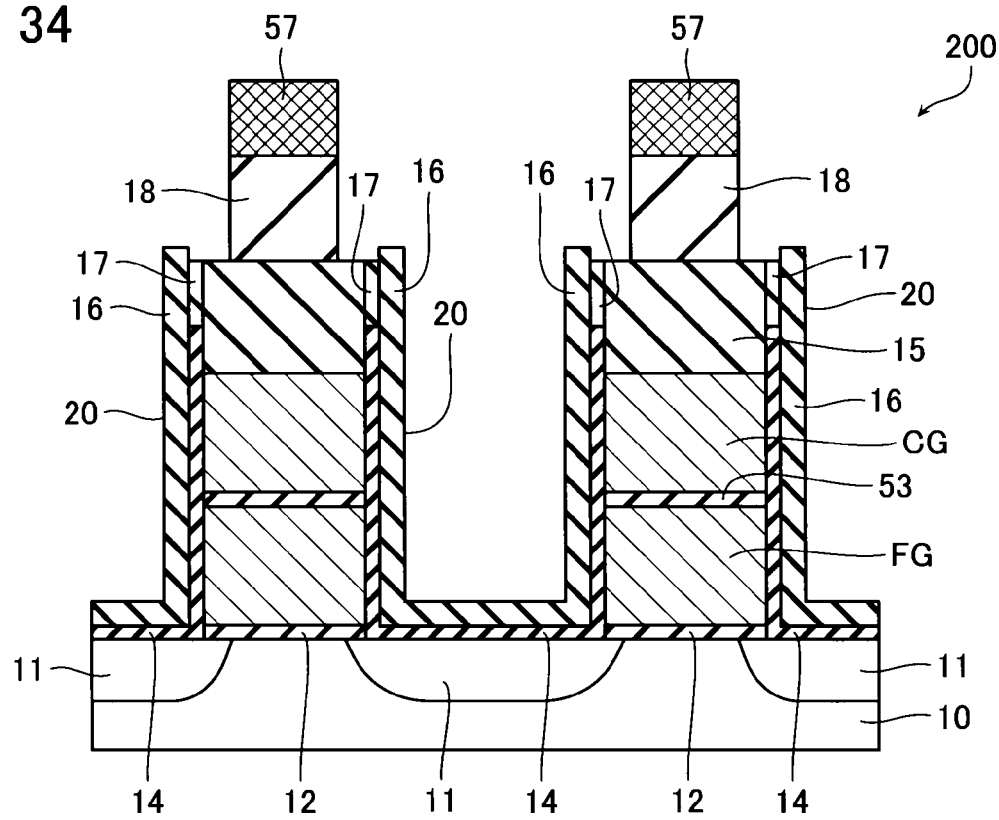

Then, the interlayer insulating film 18 is etched with a resist 57 as a mask, thereby the contact hole 20 being formed (FIG. 34). In this step, the contact hole 20 is formed without the protection insulating film 14 being etched, because the first to third silicon nitride films 15-17 serve as a stopper.

Figure 35:
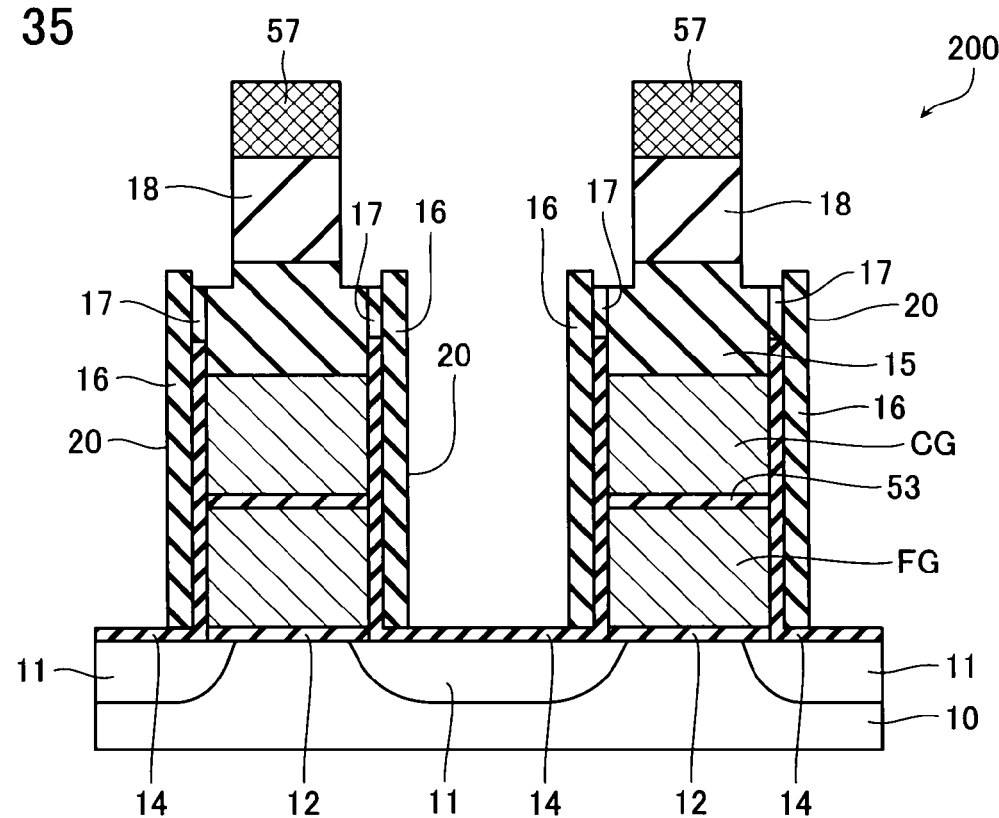
Figure 36:
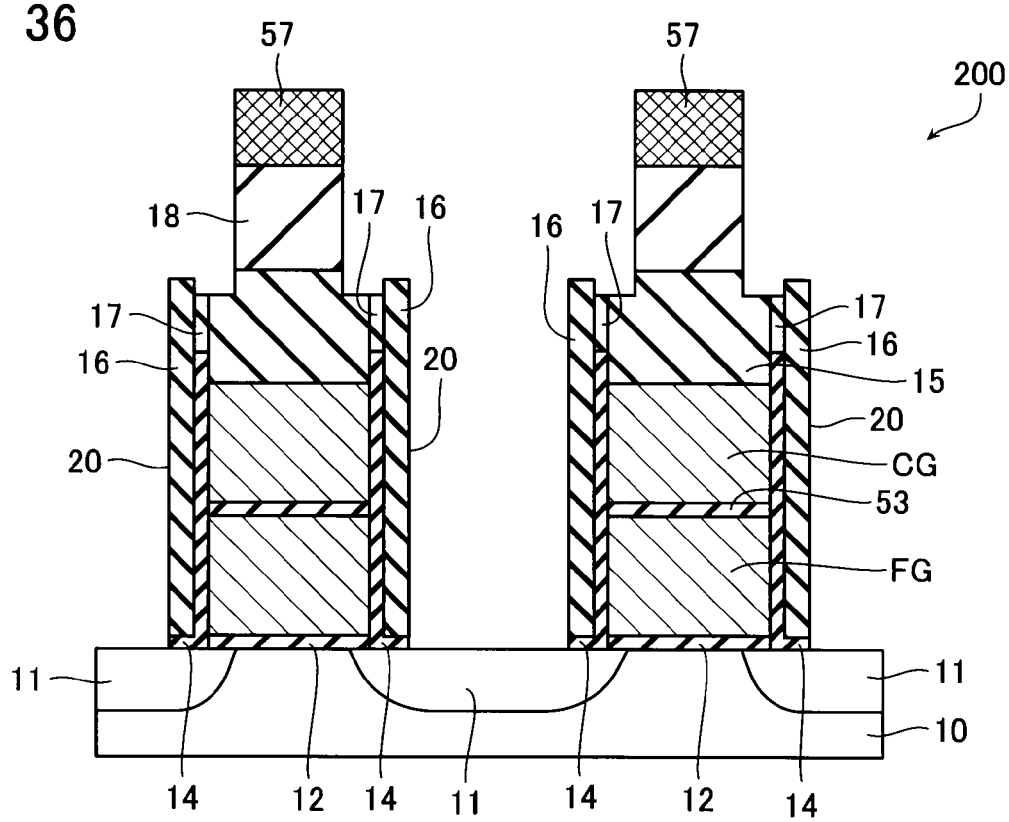
Figure 37:
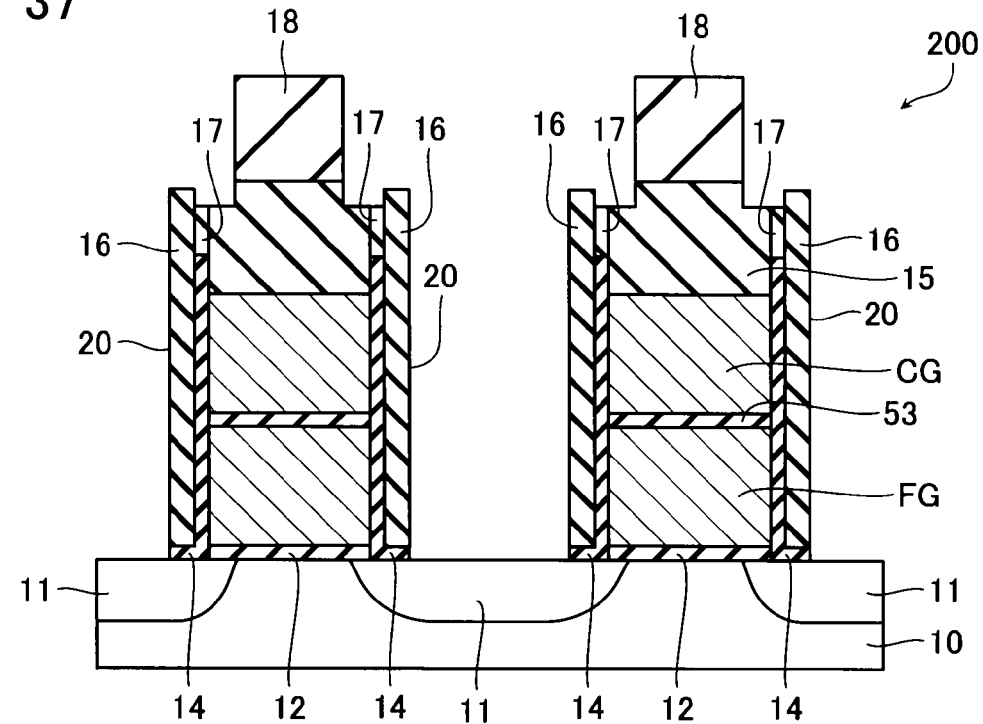

Subsequentlly, the second silicon nitride film 16 formed on the bottom of the contact hole 20 is etched by anisotropic etching (FIG. 35). Thereafter, the protection oxidation film 14 formed on the bottom of the contact hole 20 is etched by anisotropic etching (FIG. 36). Furthermore, the resist 57 is removed (FIG. 37).

In addition, a conductive layer is deposited in the contact hole 20 to form a contact 19 (FIG. 20).

Structure of Semiconductor Device 300 According to Third Embodiment

Figure 38:
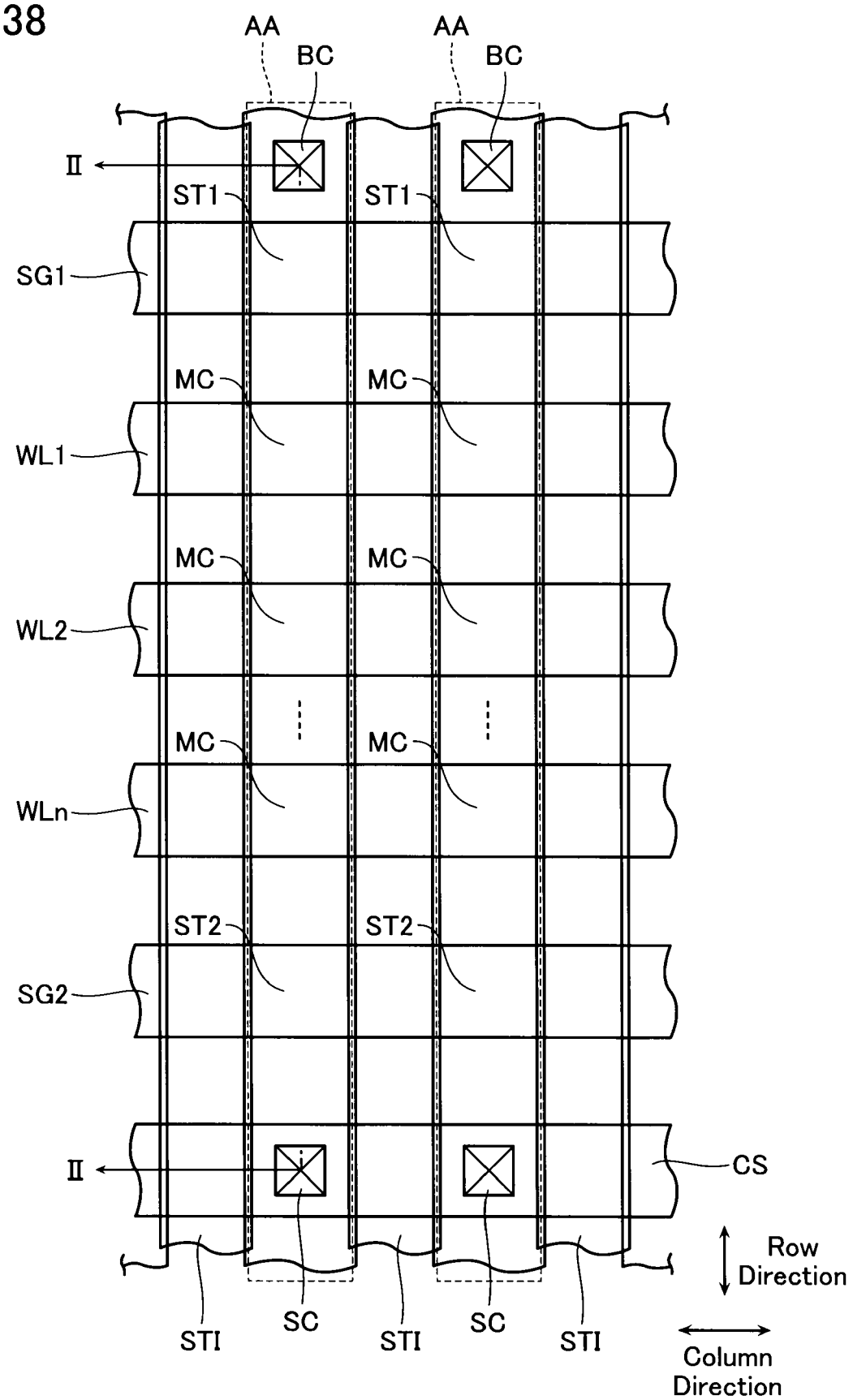
FIG. 38 is a plan view of the semiconductor device 200 according to the third embodiment.
Figure 39:
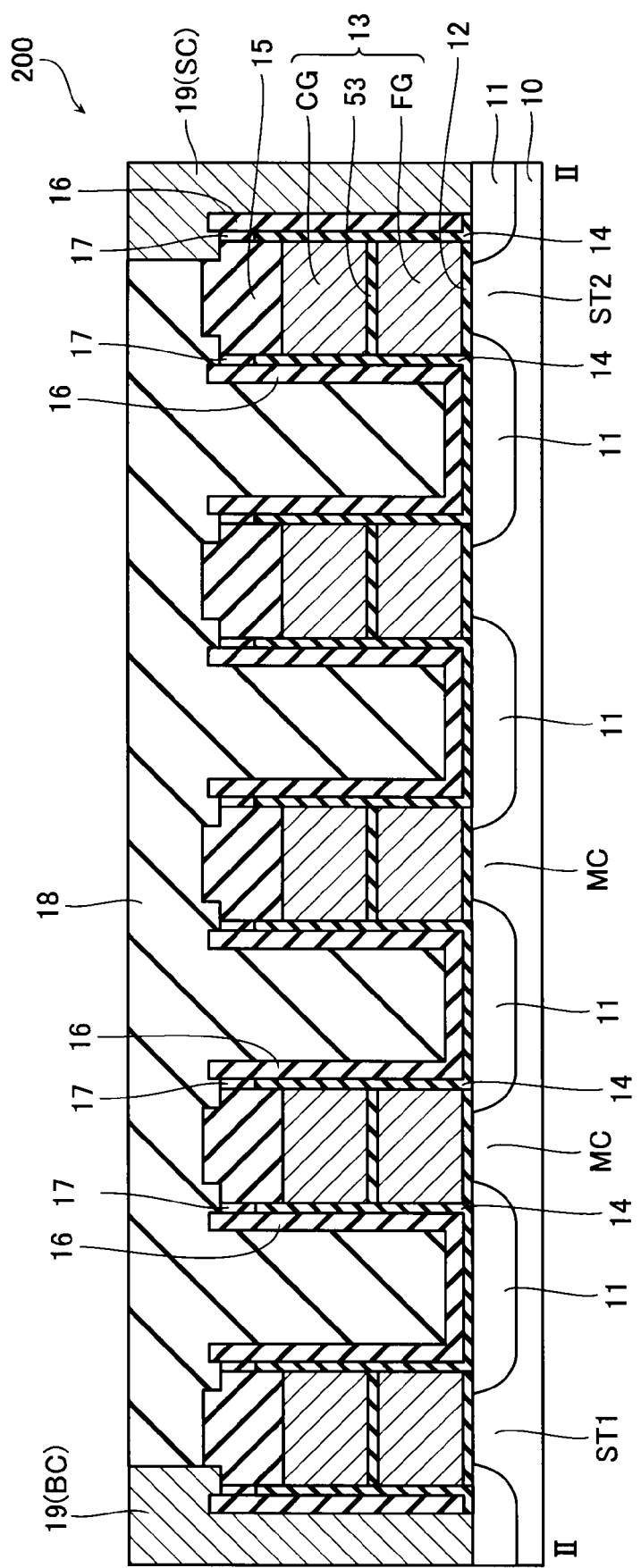
FIG. 39 is a partial sectional view of the semiconductor device 200 according to the third embodiment.

FIGS. 38 and 39 are partial plan view and a cross sectional view of the semiconductor device 300 according to the third embodiment.

This third embodiment is an example the present invention is applied to a NAND type flash memory. Note that FIG. 39 is a sectional view along the II-II line in FIG. 38. In FIG. 39, the same reference numerals are used for the same components as the first and second embodiments. The explanation on the same components as the first and second embodiments will be omitted hereinbelow.

As shown in FIG. 38, this semiconductor device 300 comprises, on the semiconductor substrate 10, element isolation regions STI, and element formation regions (active regions) AA sandwiched between the two element isolation regions STI formed adjacent to the element formation regions AA in the row direction. The element isolation region STI and the element region AA extend along column direction shown in FIG. 38.

In the element formation region AA, plural memory cell transistors MC are connected in series to form a NAND string, and select transistors ST1 and ST2 are further formed at both ends of the NAND string. One NAND cell string, select transistors ST1 and ST2 forms a NAND cell unit.

Control gates of the plurality of memory cell transistors MC formed adjacent in the row direction are commonly connected to a word line WL1-WLn, respectively. The word lines WL1-WLn extend along the row direction. The select transistors ST1 and ST2 formed adjacent along the row direction are connected to common select gate lines SGL1, SGL2, respectively. Also, a bit line BL extending in the column direction is connected to a NAND cell unit via a bit line contact BC. In addition, a common source line CS extending along the row direction is connected through a source line contact SC to the NAND cell unit.

As shown in FIG. 39, the structure of the memory cell transistor MC is the same as the second embodiment (FIG. 20B).

The select transistors ST1 and ST2 comprise, like the memory cell transistor MC, a floating gate electrode FG, and a control gate electrode CG formed through an inter-gate insulating film 53. The inter-gate insulating film 53 has an opening therein, thereby connecting (short-circuiting) the floating gate electrode FG and the control gate electrode CG.

Also, between the memory transistors MC and between the memory transistor MC and the select transistor ST, the protection insulating film 14 and the second silicon nitride film 16 are formed to have a U-shaped form, and the interlayer insulating film 18 is buried between the second silicon nitride film 16.

The third silicon nitride film 17 is formed on the protection insulating film 14 like first to second embodiments.

As shown in FIG. 39, the bottom of the third silicon nitride film 17 is formed in the higher position than the bottom of the first silicon nitride film 15. Being formed in this way, the third silicon nitride film 17 is not formed on the side of the floating gate electrode FG and the control gate electrode CG. Only the protection insulating film 14 is formed thereon.

The NAND type flash memory 300 according to the third embodiment may be formed small. This is because the contact 19 is formed in a self-alignment manner with respect to the floating gate electrode FG and the control gate electrode CG.

In addition, a silicon nitride film is suitably formed around the floating gate electrode FG, the control gate electrode CG and the protection insulating film 14. This prevents the contact 19 from being in contact with the floating gate electrode FG and the control gate electrode CG, and prevents the coupling ratio thereof from being deteriorated.

Note that the NAND type flash memory 300 according to the third embodiment can be produced by a method like the NOR type flash memory 200 according to the second embodiment.

Others

While embodiments of the present invention have been described, the present invention is not intended to be limited to the disclosed embodiments and various changes, additions or the like may be made thereto without departing from the spirit of the invention. For example, in the above-described embodiment, the third silicon nitride film 17 is formed in the higher position than the approximately middle part of the first silicon nitride film 15. But the present invention is not limited to this example. As long as the bottom of the third silicon nitride film 17 is formed in the higher position than the bottom of the first silicon nitride film 15, it is included in the scope of the present invention.

What is claimed is:

1. A semiconductor device comprising:
a semiconductor substrate;
a gate insulating film formed on the semiconductor substrate;
a gate electrode formed on the semiconductor substrate through the gate insulating film;
a first silicon nitride film formed on the upper surface of the gate electrode;
a protection insulating film formed on the side of the gate electrode;
a second silicon nitride film formed on the side of the protection insulating film;
a third silicon nitride film formed on the upper surface of the protection insulating film, and having a bottom surface formed on the upper area than the bottom of the first silicon nitride film;
wherein the gate electrode comprises:
a floating gate electrode formed on the gate insulating film;
an inter-gate insulating film formed on the floating gate electrode; and
a control gate electrode formed on the inter-gate insulating film.

2. The semiconductor device according to claim 1, wherein the protection insulating film is formed of a silicon oxide film.

3. The semiconductor device according to claim 1, wherein the protection insulating film is formed continuously on the side of the floating gate electrode, on the side of the control gate electrode, and on the semiconductor substrate.

4. The semiconductor device according to claim 3, wherein the protection insulating film is formed of a silicon oxide film.

5. The semiconductor device according to claim 1, wherein the first silicon nitride film formed in a self-alignment manner with respect to the floating gate electrode and the control gate electrode.

6. The semiconductor device according to claim 1, wherein the second silicon nitride film is formed on the side of the protection insulating film and the third silicon nitride film.

7. The semiconductor device according to claim 1, wherein the upper surface of the protection insulating film is located at a higher position than the upper surface of the control gate electrode, and
the third silicon nitride film is located between the first silicon nitride film and the second silicon film.

8. The semiconductor device according to claim 1, wherein a plurality of contacts are formed on the semiconductor substrate to extend in a vertical direction with respect to the semiconductor substrate,
and each of the contacts is formed to contact with the first to third silicon nitride films, respectively.

* * * * *